(12) United States Patent
van Woudenberg et al.

(10) Patent No.: US 8,491,154 B2
(45) Date of Patent: *Jul. 23, 2013

(54) ILLUMINATION SYSTEM

(75) Inventors: Roel van Woudenberg, Eindhoven (NL); Christoph Gerard August Hoelen, Valkenswaard (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/531,661

(22) Filed: Jun. 25, 2012

(65) Prior Publication Data

US 2012/0262904 A1  Oct. 18, 2012

Related U.S. Application Data

(63) Continuation of application No. 12/595,055, filed as application No. PCT/IB2008/051383 on Apr. 11, 2008, now Pat. No. 8,226,263.

(30) Foreign Application Priority Data

Apr. 17, 2007  (EP) ..................................... 07106284

(51) Int. Cl.
F21V 9/00  (2006.01)
(52) U.S. Cl.
USPC ............................................ 362/231; 362/84
(58) Field of Classification Search
USPC .................................... 362/230, 231, 293, 84
See application file for complete search history.

(56) References Cited

U.S. PATENT DOCUMENTS

| | | | |
|---|---|---|---|
| 6,501,091 B1 * | 12/2002 | Bawendi et al. | 257/14 |
| 6,791,259 B1 * | 9/2004 | Stokes et al. | 313/503 |
| 6,799,865 B2 * | 10/2004 | Ellens et al. | 362/240 |
| 7,052,152 B2 * | 5/2006 | Harbers et al. | 362/30 |
| 7,070,300 B2 * | 7/2006 | Harbers et al. | 362/231 |
| 2006/0226759 A1 * | 10/2006 | Masuda et al. | 313/486 |
| 2008/0180948 A1 * | 7/2008 | Yoon et al. | 362/230 |

FOREIGN PATENT DOCUMENTS

| | | | |
|---|---|---|---|
| EP | 1548851 | * | 6/2005 |
| EP | 1548851 A2 | | 6/2005 |
| EP | 1566848 A2 | | 8/2005 |
| EP | 1865564 A1 | | 12/2007 |
| WO | 9931546 A1 | | 6/1999 |
| WO | 2006098450 A1 | | 9/2006 |
| WO | 2007060573 A1 | | 5/2007 |

* cited by examiner

*Primary Examiner* — Julie Shallenberger
(74) *Attorney, Agent, or Firm* — Mark L. Beloborodov

(57) ABSTRACT

The invention provides an illumination system comprising a light-emitting device which excites a first luminescent element, which forms part of the light-emitting device. The light emitted from the first luminescent element and/or the light emitted by the light-emitting device excite a second luminescent element, physically separated from the light-emitting device. By employing two luminescent elements, the first element in the light-emitting device, and the second element physically separated from the light-emitting device, such as on a cover plate, the conversion of light produced by the light-emitting device is performed at both a "local" and a "remote" location, respectively, and the amount of luminescent material required at the remote location may be reduced compared to the situation of the prior art where the light conversion was only performed at a remote location.

18 Claims, 16 Drawing Sheets

ILLUMINATION SYSTEM

FIELD OF THE INVENTION

The invention relates to illumination systems.
The invention also relates to a display device comprising an illumination system.

BACKGROUND OF THE INVENTION

Illumination systems are known per se and are used to provide light in both functional applications and decorative applications. In functional applications, such as street lamps, ceiling- and wall-mounted lighting fixtures, the light is typically provided to counteract reduced visibility and the light output is therefore configured accordingly. The requirements on the light output may include parameters such as wavelength spectrum, color point or color temperature, intensity, solid angle, light area, luminous power, luminance etc. Generally, the wavelength spectrum relates to the color of the light. In illumination applications such as general lighting or product highlighting, the color rendering properties of the light generally is an important requirement on the light output, which relates to the wavelength spectrum, and which generally is expressed as the general color rendering index (CRI). In decorative applications, such as ceiling and wall-mounted light tiles, poster boxes, signs and logos, the required light output is mainly determined on aesthetic grounds. Also known are illumination systems which configure the output light to satisfy both these functional and decorative requirements to varying degrees. Illumination systems may also be used in, for example, projection systems such as a digital projector, or so-called beamer, for projecting images or displaying a television program, a film, a video program or a DVD, or the like. In display applications, the color gamut of the system generally is an important requirement on the spectral composition of the light output.

Illumination systems where the light is provided for use by an associated object are also known. For example, liquid crystal display devices, also referred to as LCD display, where the illumination system is a backlight and the associated object is a non-emissive LCD panel. Such display devices are used, for example, in television receivers, (computer) monitors, (cordless) telephones and portable digital assistants. Typically, the output light requirements of a display device specify the light reflected and/or transmitted by the associated object—consequently the optical characteristics of the associated object need to be taken into consideration when the light-output requirements for the illumination system are determined.

In some of these applications, such as a backlight for use in an LCD display, the requirements on the light output of the illumination system may be quite strict, and available light-emitting devices may not meet these requirements sufficiently. This is also true for light-emitting diodes (LED's), which are considered attractive semiconductor light-emitting devices for use in a backlight because of their energy efficiency and compact size. To help achieve the light output requirements, luminescent elements are frequently employed to absorb the photons, produced by the light-emitting device, which have a certain wavelength spectrum, and to emit photons having a different wavelength spectrum. Phosphors are a well-known example of luminescent elements, and the process of absorption and subsequent emission is often referred to as conversion, or wavelength conversion.

An additional problem is that the optical characteristics of the associated object may vary—for example, LCD panels may be produced using different techniques and different materials by different manufacturers—which means that the output light requirements on the associated illumination system must also vary. In other words, one illumination system, for example, one backlight, may not be suitable for the whole range of associated objects even when luminescent elements are used.

For example, U.S. Pat. No. 7,052,152 discloses in FIG. 12A an LCD panel using a backlight, in which a phosphor is employed on the cover plate of the backlight as a luminescent element. This has the advantage that the cover plate with phosphor can be matched to the LCD panel, and the rest of the backlight may be standardized in terms of light output. However, a drawback of the known illumination system with the phosphor on the cover plate is that variation in phosphor layer thickness causes spatial intensity and color variations in the light emitted by the phosphor. Such variations are noticeable by the user of the LCD panel and considered undesirable.

SUMMARY OF THE INVENTION

It is an object of the invention to provide an illumination system which provides a more uniform intensity and color output.

According to a first aspect of the invention the object is achieved with an illumination system comprising a semiconductor light-emitting device configured to emit light of a first primary color, the semiconductor device comprising a first luminescent element which is configured to absorb at least part of the light of the first primary color and to emit light of a second primary color; a second luminescent element, physically separated from the semiconductor light-emitting device, and configured to absorb at least part of the light of the first or second primary colors and to emit light of a third primary color; and the illumination system being configured to combine at least one or more of said first, second and third primary colors to form the output light of the illumination system.

Light of a primary color comprises light of a predefined spectral bandwidth around a central or dominant wavelength. In display devices typically three primary colors are used, for example, Red, Green and Blue. By using Red, Green and Blue a full color output light can be generated by the illumination system, including white. The number of primary colors used in the display device may vary depending upon the required output—for example Red, Green, Blue, Cyan and Yellow which enable the generation of full color output light, or Blue and Yellow which may be used to make white. When an illumination system is used as a backlight in a display device, the illumination system is usually configured to produce a specified white light at the front of the device, known as Front-of-Screen (FoS). This is the light perceived by the user of the display device. The use of the terms Red, Green, Blue, Yellow and Cyan light should not be interpreted as specifying specific central wavelengths, but rather as indicating which region of the color spectrum the dominant wavelength belongs to. These terms are chosen because it is relatively easy to visualize the approximate color spectrum when one or more of these primary colors are mixed—for example, Red and Yellow light may be mixed in varying degrees to produce an output light from Red, through Orange, to Yellow; or, for example, Red and Green light may be mixed in varying degrees to produce an output light from Red, through Orange and Yellow, to Green. Consequently, within the same illumination system more than one of each primary color may be produced, for example a first Blue light and a second Blue light. This should be interpreted as two spectra having central wavelengths from the Blue region of the color spectrum. There are many different diagrammatic representations of color—in this application, color points are depicted on 1976 CIE chromaticity diagrams, and in that context a color point of light is expressed in the CIE 1976 u'v'color coordinates.

The effect of the illumination system according to claim 1 is that by employing two luminescent elements, the first element in the light-emitting device, and the second element physically separated from the light source, such as on a cover plate, the conversion of light produced by the light-emitting device is performed at both a "local" and a "remote" location, respectively, and the amount of luminescent material required at the remote location may be reduced compared to the situation of the prior art where the light conversion was only performed at a remote location. For a uniformly distributed phosphor layer at the remote location this can be achieved by reducing the effective thickness of the phosphor layer, where the effective thickness represents the thickness of a pure, non-porous phosphor layer with the same phosphor mass per unit area. A thinner remote layer of luminescent material means less sensitivity to thickness variations, and thus fewer spatial variations in color and intensity.

A further benefit of the illumination system according to the invention is that the remote luminescent element may still be matched to the object to be illuminated, permitting a high degree of standardization in the construction of the rest of the illumination system.

The invention is based on the recognition that the spatial variations in output light could be reduced by reducing the degree of conversion within the luminescent material at the remote location instead of the traditional approach, which is to try to reduce the thickness variations during the manufacturing of the remote luminescent element, such as during the deposition process.

According to an aspect of the invention, an illumination system is provided wherein the light conversion by the first luminescent element is configured to provide a greater degree of light conversion than the second luminescent element, the degree of light conversion being measurable by the shift in color point on a 1976 CIE chromaticity diagram away from the color point of the primary color. This is advantageous because the first tuning step comprises the majority of the color shift or light conversion. The second tuning step then performs a very small amount of correction, or light conversion. This means that the second luminescent layer is only required to fine-tune the color point, and the conversion performed by the second luminescent layer may be minimized.

According to an aspect of the invention, an illumination system is provided wherein the effective thickness of a first phosphor material in the first luminescent element is greater than the effective thickness of a second phosphor material in the second luminescent element. This also has the effect of minimizing the amount of conversion performed in the second luminescent element.

According to an aspect of the invention, an illumination system is provided wherein the light of the third primary color has a dominant wavelength that is larger than or equal to the dominant wavelength of the light of the second primary color. This may be advantageous because many common phosphors, when employed as a luminescent element, emit photons of a lower energy/longer wavelength compared to the photons they absorb.

According to an aspect of the invention, an illumination system is provided wherein the second luminescent element is further configured to absorb at least part of the light of the first and second primary colors. This allows the second luminescent element to absorb both first and second primary colors to increase the output of the third primary color. This means that, if desired, the amount of the first primary color which is not absorbed by the first luminescent element may be reduced.

According to an aspect of the invention, an illumination system is provided wherein the light of the first primary color comprises one or more of blue light, ultra-violet light and near-UV light. Sources of these types (such as blue and UV LEDs) are generally available, and tend to be the typical sources used for backlights.

According to an aspect of the invention, an illumination system is provided wherein the semiconductor light-emitting device further comprises a semiconductor ultra-violet light or near-UV light emitter, and a third luminescent element configured to absorb at least part of the light emitted by the emitter and configured to emit light of the first primary color. For example, an ultra-violet LED may be used, which is a typical source for backlights.

According to an aspect of the invention, an illumination system is provided wherein the first luminescent element comprises a layer of at least one phosphor material, disposed as a contiguous or conformal layer on the semiconductor light-emitter die.

According to an aspect of the invention, an illumination system is provided
wherein
the semiconductor light-emitting device further comprises a primary optic, and the first luminescent element comprises a layer of at least one phosphor material, disposed as a contiguous layer on the primary optic. For example, the phosphor material may be applied in a "bulb" form. This minimizes the amount of phosphor material required to form the first luminescent element compared to a situation where the phosphor material is applied to a cover plate or optical element.

According to an aspect of the invention, an illumination system is provided
wherein
the first luminescent element comprises a phosphor material selected from the group consisting of YAG:Ce, (Y,Gd)AG:Ce, (Y,Lu)AG:Ce, (Y,Lu,Gd)AG:Ce and LuAG:Ce; YAGSN:Ce, (Y,Lu,Gd)AGSN:Ce, LuAGSN:Ce and any combination thereof.

According to an aspect of the invention, an illumination system is provided
wherein
the first luminescent element comprises a phosphor material which is an oxynitrido-silicate phosphor, such as SSON:Eu.

According to an aspect of the invention, an illumination system is provided wherein the second luminescent element comprises two or more phosphor materials which are physically separated from each other. This provides maximum flexibility to use phosphors which may not be chemically compatible, or which cannot be mixed for practical reasons, or which may tolerate different degrees of conversion.

According to an aspect of the invention, an illumination system is provided wherein the second luminescent element is further configured to emit light of a fourth primary color, and wherein the illumination system is configured to combine light of at least one or more of said first, second, third and fourth primary colors to form the output light of the illumination system. This means that phosphor materials with color points from different regions of the color spectrum may be comprised in the second luminescent element, providing a very large degree of flexibility in achieving a target color for the output light.

According to an aspect of the invention, an illumination system is provided wherein the second luminescent element comprises at least one phosphor material selected from the group consisting of SCSN:Eu, SSN:Eu, BSSN:Eu, (Y,Gd)AG:Ce, (Y,Lu)AG:Ce, (Y,Lu,Gd)AG:Ce, YAG:Ce, LuAG:Ce, LuAGSN:Ce, TG:Eu, SSON:Eu, YAGSN:Ce, SCASN:Eu, CASN:Eu, (Ca,Sr)S:Eu, SrS:Eu, CaS:Eu, BOSE and any combination thereof.

According to an aspect of the invention, an illumination system is provided wherein the light of the first primary color comprises blue light, the first luminescent element is configured such that the light of the second primary color comprises yellow light, and the second luminescent element is configured such that the light of the third primary color comprises yellow light. This provides a typical backlight light output, which approximates to white. The yellow light is produced in a two-step conversion process.

According to an aspect of the invention, an illumination system is provided wherein the light of the first primary color comprises blue light, the first luminescent element is configured such that the light of the second primary color comprises yellow light, and the second luminescent element is configured such that the light of the third primary color comprises yellow light and the light of the fourth primary color comprises green light.

According to an aspect of the invention, an illumination system is provided wherein the light of the first primary color comprises blue light; the first luminescent element is configured such that the light of the second primary color comprises yellow, yellow-green or green light; and the second luminescent element is configured such that the light of the third primary color comprises red light.

According to an aspect of the invention, an illumination system is provided wherein the light of the first primary color comprises blue light; the first luminescent element is configured such that the light of the second primary color comprises yellow, yellow-green or green light; and the second luminescent element is configured such that the light of the third primary color comprises red light and the light of the fourth primary color comprises yellow, yellow-green or green light.

According to an aspect of the invention, an illumination system is provided wherein the second luminescent element comprises a first phosphor material selected from the group consisting of TG:Eu, BOSE, SSON:Eu, LuAG:Ce and any combination thereof, and a second phosphor material selected from the group consisting of BSSN:Eu amber, BSSN:Eu red, SCSN:Eu, SSN:Eu, SCASN:Eu, CASN:Eu, (Ca,Sr)S:Eu, SrS:Eu, CaS:Eu and any combination thereof.

According to an aspect of the invention, an illumination system is provided wherein the light of the first primary color comprises blue light, the first luminescent element is configured such that the light of the second primary color comprises yellow and green light, and the second luminescent element is configured such that the light of the third primary color comprises red light.

According to an aspect of the invention, an illumination system is provided wherein the light of the first primary color comprises blue light, the first luminescent element is configured such that the light of the second primary color comprises yellow light, and the second luminescent element is configured such that the light of the third primary color comprises yellow light.

BRIEF DESCRIPTION OF THE DRAWINGS

These and other aspects of the invention are apparent from and will be elucidated with reference to the embodiments described hereinafter.

In the drawings:

FIGS. 1, 4, 5 and 11 to 16 are purely diagrammatic and not drawn to scale. Particularly for clarity, some dimensions are exaggerated strongly. Similar components in the Figures are denoted by the same reference numerals as much as possible.

DETAILED DESCRIPTION OF THE PREFERRED EMBODIMENTS

Figure 1:
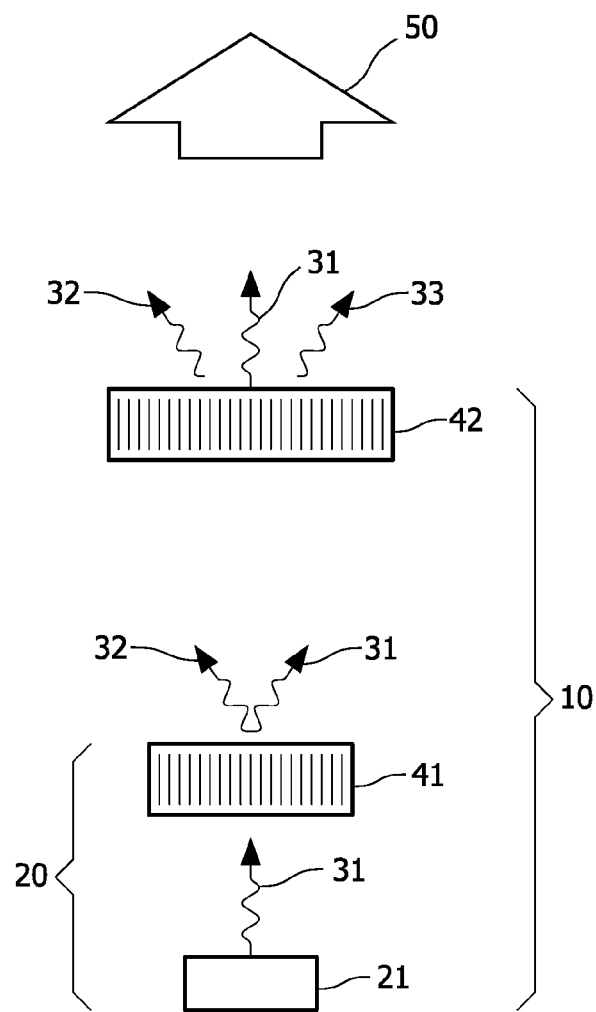
FIG. 1 shows a schematic cross-sectional view of an illumination system according to the invention.

FIG. 1 shows a schematic cross-sectional view of illumination system 10 according to the invention. The illumination system 10 comprises a semiconductor light-emitting device 20 which emits Blue light 31 in the direction of a first phosphor layer 41. Typically, it is the chip or die 21 of the light-emitting device 20 which emits the light. The first phosphor layer 41, which forms part of the semiconductor light-emitting device 20 and is thus physically very close to the source of Blue light, is arranged to intercept at least some of the Blue light, and the phosphor material is selected to absorb the Blue light 31 and to emit a first Yellow light 32 due to the excitation by the Blue light 31. Due to its proximity to the Blue light source, the first phosphor layer 41 may be referred to as a "local" phosphor layer.

Phosphor materials suitable for use in the first phosphor layer 41 include garnet phosphors. Garnet phosphors have the following general formula:

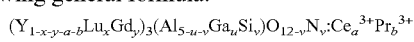

wherein $0 \leq x < 1$, $0 \leq y < 1$, $0 < (x+y+a+b) \leq 1$, $0 \leq u < 2$, $0 \leq v < 2$, $0 < a < 0.25$, $0 < b < 0.25$;

Additionally, this general formula of garnet phosphors may be modified as follows:

Y may also partly be replaced by one or more elements from the group consisting of rare earth metals, La, Sm and Ca;

Al may also be replaced by one or more elements from the group consisting of (Sc, Lu, In and Mg);

Si may also partly be replaced by one or more elements from the group consisting of (Ge, Ti, Zr and C)

In particular, a Ce-activated garnet phosphor may be used, for example YAG:Ce, (Y,Gd)AG:Ce, (Y,Lu)AG:Ce, (Y,Lu,Gd)AG:Ce and LuAG:Ce; or garnet phosphors additionally comprising Si and N, for example YAGSN:Ce, (Y,Lu,Gd)AGSN:Ce, and LuAGSN:Ce.

Tables 2A to 2F indicate for each phosphor the abbreviation used, the chemical formula and the general group of phosphors to which it belongs. Note that (A,B) in an abbreviation or formula means that both elements are present, and that the sum of the fractions of A and B is unity.

It may also be advantageous to use a combination of more than one phosphor materials—the combination may be implemented as a mixture of phosphor materials within a single phosphor layer 41, or it is possible to use a first phosphor layer 41 comprising more than one adjacent sub-layers where each sub-layer comprises a different phosphor material or a different mixture of phosphor materials. The phosphors may be applied as a dispersion of phosphor particles in a matrix material such as, e.g. transparent or translucent silicone gel or silicone rubber.

The phosphor layer 41 may be provided in the form of a solid state fluorescent element, known as color converter plate (CCP). The converter plate may be of ceramic type or of polymer dispersed type. Such a color converter plate is described in the unpublished application no. 05111202.7 (European Patent attorney's docket PH002516EP1).

Additionally, the first phosphor layer 41 is arranged to allow a portion of the Blue light 31 to pass through the layer. For example, the phosphor layer 41 may be patterned, that is concentrated in shapes such as stripes, rectangles or dots, thus providing areas of higher transmission for the Blue light 31 so that Blue light 31 may be directed towards a second phosphor layer 42. The pattern density is therefore one factor in determining the amount of phosphor conversion performed by the first phosphor layer 41 and therefore in determining the color of the light emitted.

Alternatively, the phosphor material distribution within the layer 41 may be chosen to permit a certain percentage of Blue light 31 transmission and a certain percentage of Blue light 31 absorption by the first phosphor layer 41. Typically, the phosphor material is applied in a suspension of carrier material—a phosphor layer 41 therefore comprises both phosphor material and a carrier material. The phosphor layer thickness, the concentration of the phosphor particles and the size of the phosphor particles determine the amount of phosphor conversion performed by the first phosphor layer 41 and therefore determine the color emitted.

A second phosphor layer 42 is disposed at a distance from the light-emitting device 20, and is arranged to intercept at least some of the Blue light 31. Due to its distance from the Blue light 31 source, the second phosphor layer 42 may be referred to as "remote" phosphor layer. The phosphor material is selected to emit a second Yellow light 33 due to the excitation by the Blue light 31. Phosphor materials suitable for this conversion include those indicated as suitable for the first phosphor layer 41. It may also be advantageous to use more than one of these phosphors in combination within the second phosphor layer 42.

Similarly, the second phosphor layer 42 is arranged to allow a portion of the Blue light 31 to pass through and to direct the Blue light 31 out of the illumination system 10 as a part of output light 50. Similarly to the first phosphor layer 41, this may be done by patterning the phosphor layer 42 or choosing an appropriate phosphor material distribution within the layer.

During operation, the first phosphor layer 41 absorbs Blue light 31 and emits a first Yellow light 32. Blue light 31 also passes through the first phosphor layer 41 to a degree determined by the configuration of the first phosphor layer 41. A substantial portion of the emitted first Yellow light 32 passes through the second phosphor layer 42 and leaves the illumination system 11 as part of the output light 50. The second phosphor layer 42 absorbs a portion of the Blue light 31 passing through the first phosphor layer 41 and emits the second Yellow light 33 which passes out of the illumination system 10 to become a part of the output light 50. Blue light 31 also passes through the second phosphor layer 42 to a degree determined by the configuration of the second phosphor layer 42. The illumination system 10 of FIG. 1 produces a white output light 50 comprising Blue 31, the first Yellow light 32 and the second Yellow light 33. The illumination system 10 is suitable for use as a backlight for an LCD display.

The first Yellow light 31 and the second Yellow light 32 are two color spectra, which both have a dominant wavelength in the Yellow part of the color spectrum.

Alternatively, the phosphor material in the second phosphor layer 42 may be selected to absorb at least a part of the first Yellow light 32 to cause the excitation of the phosphor. It will also be apparent to the skilled person that one or more phosphor materials may be selected to absorb both the Blue light 31 and the first Yellow light 32 to cause the excitation of the second phosphor layer 42.

In a preferred embodiment, the phosphor material used in the first phosphor layer 41 is the same as the phosphor material used in the second phosphor layer 42. In general, the first Yellow light 31 and the second Yellow light 32 will be the same, although there may be some slight differences in wavelength spectra due to factors such as the phosphor layer thickness, the concentration of the phosphor particles, the size of the phosphor particles and pattern density of each phosphor layer 41,42.

The semiconductor light-emitting device 20 may produce Blue light 31 directly, or said Blue light 31 may be produced indirectly. For example, the device 20 may directly produce a primary color, such as UV or near-UV light, which is converted within the device by a suitable luminescent element, such as a phosphor layer, to Blue light 31. Advantageous is the use of a luminescent element, such as a Color Converter Plate, which is mounted directly onto the chip or die 21 of the device 2. This allows fine tuning of the Blue light 31 wavelength spectrum.

Figure 2A:
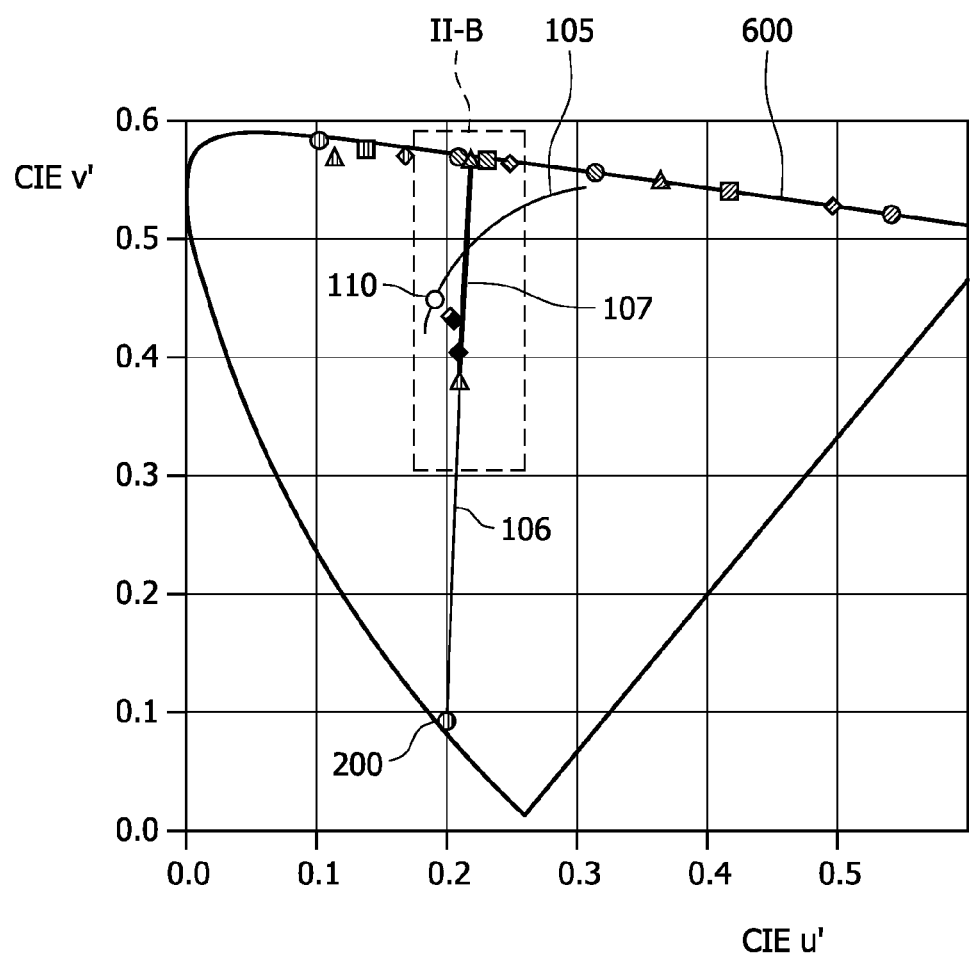
FIG. 2A depicts a chromaticity diagram of the CIE 1976 type showing the color space for an illumination system according to the invention.
Figure 2B:
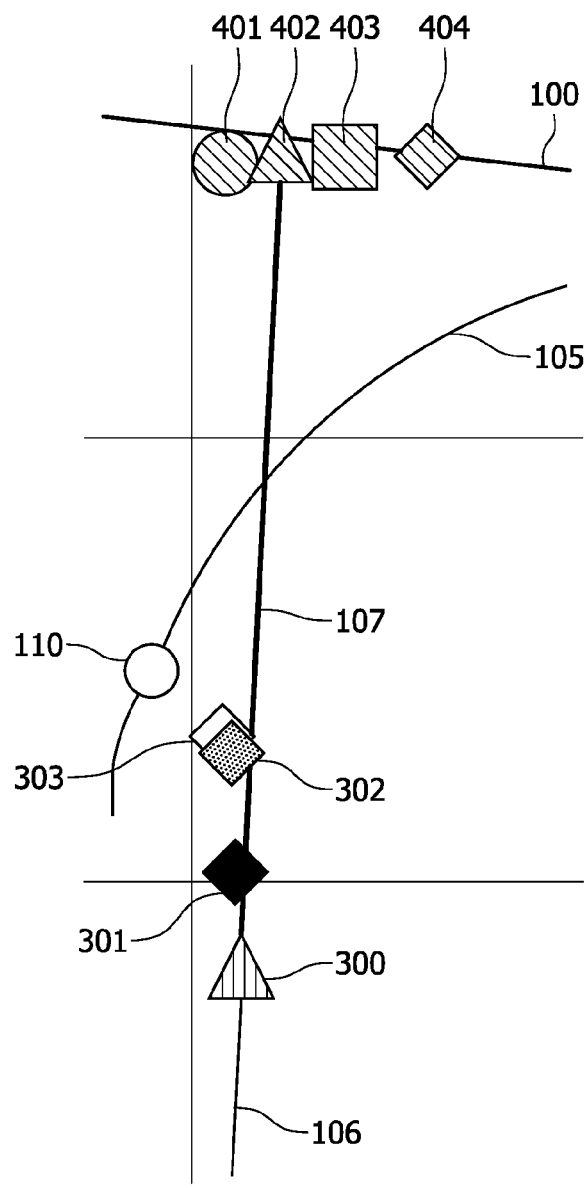
FIG. 2B shows an enlarged view of the centre portion II-B of FIG. 2A.

FIGS. 2A and 2B depict a chromaticity diagram showing the color space available for tuning the color of the white output light 50 from the illumination system 10 of FIG. 1. The chromaticity diagram is of the CIE 1976 type, with CIE u' along the horizontal axis and CIE v' along the vertical axis. FIG. 2B depicts an enlarged view of the centre portion II-B of the chart of FIG. 2A.

In FIGS. 2A and B, 600 is the spectral locus, which represents the limit of the color space, i.e. it represents fully saturated colors. 105 is the black body locus (BBL) or Planckian locus which represents the path a black body would take in the color space as its black body temperature changes, and 110 is the 9000K point on the black body locus 105. 200 represents the color point of the Blue light 31 produced by a blue LED. 301, 302, and 303 represent the target color points required by three manufacturers for the illumination system 10 when it is employed as a backlight for their respective LCD panel to achieve a front-of-screen color point on the BBL with a color temperature of 9000K—the color point will be shifted by each LCD panel to a different degree depending upon its optical characteristics. By specifying the color point of the output light 50 of the illumination system in consideration of the shift expected by the LCD panel, the end result for the user i.e. the Front-of-Screen (FoS) color will be an acceptable white, lying on or close to the black body locus 105. For example, it will approach as closely as possible to the 9000K point 110.

401, 402, 403 and 404 are the color points for Yellow phosphors LuAGSN:Ce, YAG:Ce, YAGSN:Ce and (Y, Gd)AG:Ce, respectively. When YAG:Ce is employed as the phosphor material in the first phosphor layer 41 and the second phosphor layer 42 of FIG. 1, the loci 106 and 107 in FIGS. 2A and 2B represent the locus of possible output light 50 colors available as the influence of phosphor material in the phosphor layers 41, 42 is varied. In other words, the amount of conversion by the phosphor material in the phosphor layers 41,42 determines the relative shift along the loci 106, 107. Target point 300 represents a selected limit for the color point shift due to the first phosphor layer 41.

The color of the output light 50 is initially determined by the Blue light 31 from the semiconductor light-emitting device 20 which is represented by the color point 200. As the influence of YAG:Ce phosphor material in the first phosphor layer 41 is increased, for example, by increasing the percentage of YAG:Ce in the first phosphor layer 41, a greater amount of Yellow light 32 is produced by the first phosphor layer 41 and the color point of the output light 50 moves from the blue LED color point 200 along the locus 106,107 towards the YAG:Ce color point 402. Conversely, a lower percentage of YAG:Ce in the first phosphor layer 41 would move the output light 50 color point along the locus 106,107 back towards the blue LED 200. The illumination system 10 of FIG. 1 may therefore be configured to produce any output light 50 along the locus 106,107 intersecting or closely approaching the target points 301,302,303 of the different LCD panel manufacturers.

The tuning of the color point of the output light 50 is achieved in two stages:
(1) a first tuning, where the shift in color along locus 106,107 from blue LED point 200 is performed in the first phosphor layer 41 due to the light conversion; and
(2) a second tuning, where a further shift in color along locus 106,107 is performed by the remote phosphor layer 42 due to light conversion. Any desired color point on the locus 107 may therefore be attained, including points closely approaching the target points for the different LCD manufacturers 301, 302, 303.

In a preferred embodiment, the first tuning step comprises the majority of the color shift or light conversion, from blue LED point 200 to the target point 300, and is represented by locus 106. Target point 300 on the locus 106, 107 is chosen to be slightly closer to the LED blue color point 200 than the points on the locus 106,107 which closely approach the target points for the different LCD manufacturers 301, 302, 303. The second tuning step then performs a very small amount of correction, or light conversion, along locus 107 to attain the desired target point close to the color points for the different LCD manufacturers 301, 302, 303. This means that the second phosphor layer 42 is only required to fine-tune the color point, and the conversion performed by the phosphor material in the second phosphor layer 42 may be minimized.

Figure 3A:
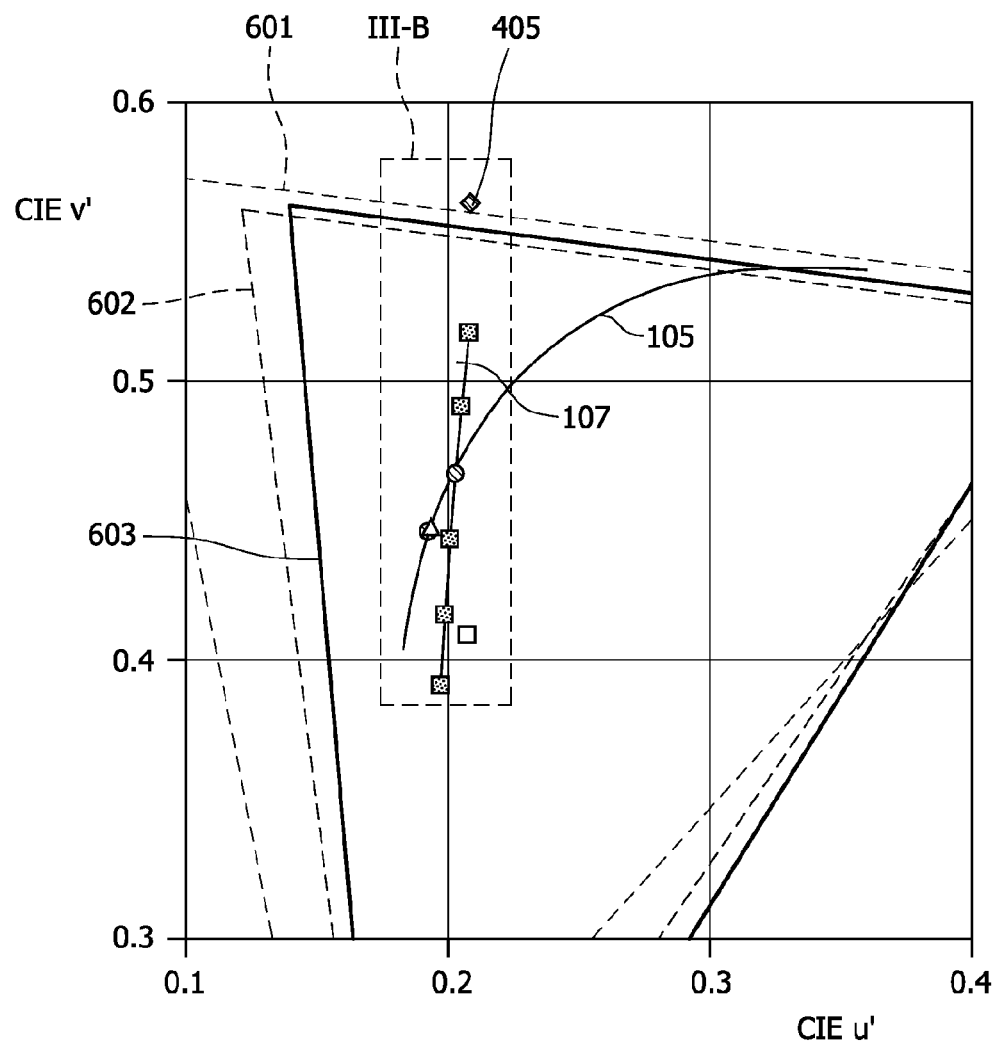
FIG. 3A shows a chromaticity diagram of the CIE 1976 type for the illumination system according to the invention.
Figure 3B:
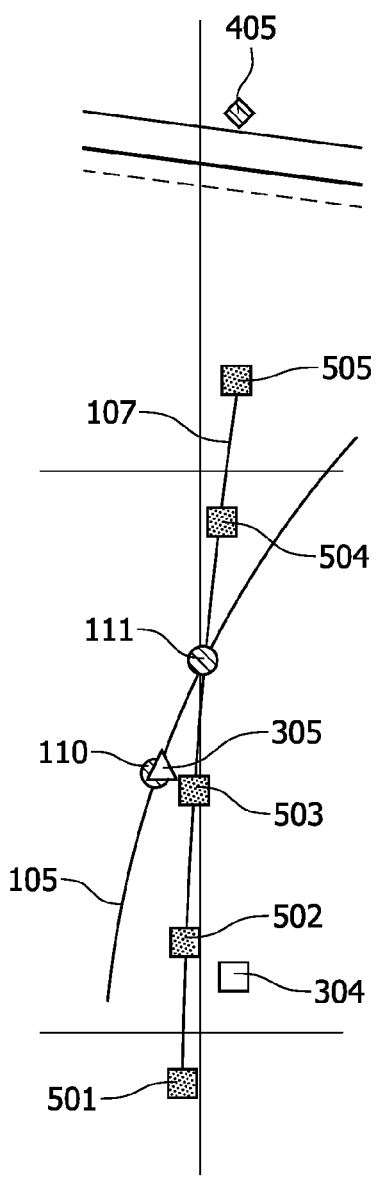
FIG. 3B shows an enlarged view of the centre portion III-B of FIG. 3A.

FIGS. 3A and 3B show a 1976 CIE chromaticity diagram, indicating the estimated change in color point due to variations in the thickness of the second phosphor layer 42 for the illumination system 10 of FIG. 1. FIG. 3B is an enlarged view of the centre portion III-B of the chart shown in FIG. 3A. Locus 107 indicates the change in color point as the effective thickness of the phosphor material in the phosphor layer 42 on a translucent cover plate is increased. 105 is the black body locus (BBL) and 110 and 111 are the 9000K and 8500K points, respectively, on this black body locus 105. 304 represents the target color point for a backlight to be used in combination with a LCD panel from a particular manufacturer, and 305 represents the desired Front-of-Screen color point as observed by the user of said LCD panel. Point 305 coincides with the 9000K color point 110 on the black body locus 105. Locus 603 represents the color gamut for the display device comprising said LCD panel. Loci 601 and 602 represent the standardized National Television System Committee (NTSC) and European Broadcasting Union (EBU) color gamuts, respectively. 405 is the color point of the YAG-based Yellow phosphor. Table 1 shows the effective thickness in microns of each of the color points 501, 502, 503, 504 and 505.

TABLE 1

Thicknesses of experimental YAG-based phosphor layer

| Color point in FIGS. 3A and 3B | Effective phosphor thickness (micron) | Total phosphor layer thickness (micron) |
|---|---|---|
| 501 | 0.56 | 16 |
| 502 | 0.77 | 22 |
| 503 | 1.1 | 30 |
| 504 | 2.0 | (*) |
| 505 | 3.4 | (*) |

(*) These figures were not recorded

To make the calculations simpler, the amount of phosphor material within the phosphor layer 42 has been mathematically transformed into an effective thickness of phosphor material only, by determining, from the phosphor density in the film and from the film thickness, the mass load with phosphor particles in the film per unit area, and, using the specific density of the phosphor, by calculating the thickness of a pure, pore-free, phosphor layer that this phosphor mass per unit area would correspond to.

For example, a 30 micron thick phosphor layer comprising phosphor particles in an organic matrix material typically would correspond to approximately a 1-2 micron effective YAG phosphor thickness. If coating losses are ignored, 1 micron of effective YAG thickness corresponds to about 5 grams per square meter.

Increasing the effective thickness of the YAG-based phosphor layer moves the color point along locus 107 towards the color point 405 of the YAG-based Yellow phosphor. As depicted in FIG. 3B, a small variation in effective thickness may cause a large change in color point, causing the output light 50 to miss the target point 304. Based on modeling and experiments, it is estimated that the effective layer thickness needs to stay within about a 5% tolerance over the whole area of the second phosphor layer 42 as well as from system to system when the illumination system 10 is configured as a backlight for an LCD panel. This is because the requirements for spatial intensity and color variations and panel-to-panel intensity and color variations demand that the requirements of the user are fulfilled. When the second phosphor layer 42 is located close or even adjacent to the LCD panel, the second phosphor layer 42 will have dimensions comparable to those of the LCD panel. Additionally, the close proximity between the LCD panel and the second phosphor layer 42 means that there is little available room for optical mixing to achieve further spatial homogenization of the output light, and little room to add a diffuser to improve the uniformity of the output light 50. For example, if the illumination system 10 of FIG. 1 was to be configured for a 42-inch 16:9 LCD panel, the second phosphor layer 42 would have an area of about 0.5 square meters. Achieving a tolerance of 5% over an area of 0.5 square meters is difficult, especially when the phosphor material is not applied directly in a layer but in a suspension with a carrier material.

In the embodiment of FIG. 1, two phosphor layers are used—a local layer 41 and a remote layer 42. This means that the required relative thickness of the second phosphor layer 42 may be reduced by performing the conversion at two locations. Reducing the amount of conversion required by the second phosphor layer 42 means that the influence of thickness variations in the second phosphor layer 42 is also reduced. Thickness variations in the first phosphor layer 41 are less of a problem because there is enough room between the first phosphor layer 41 and the associated object to mix the light, and/or there may be enough room to add a diffuser if required. Alternatively, the semiconductor light emitting devices are pre-selected and/or arranged in pre-determined configurations to achieve the required uniformity of the output light.

The problem would be avoided completely by performing conversion only in the first phosphor layer 41, but a multi-stage conversion using a second phosphor layer 42 means that it is still possible to match the second phosphor layer 42 to the associated object, such as an LCD panel, so that variations in the LCD panel's optical characteristics do not require completely different backlights to be manufactured—the only difference is the second phosphor layer 42. Standardization of backlight production provides a major economic advantage as production costs are reduced, and the necessity for measurement and tuning during manufacturing is reduced. Also the time-to-market for new LCD panels is reduced as existing back-lights may simply be fitted with an appropriate second phosphor layer 42. An additional advantage is that less phosphor material is required as the area of the first phosphor layer 41 is typically smaller, because it only needs to correspond to the dimensions of the semiconductor light-emitting device 20.

Figure 4:
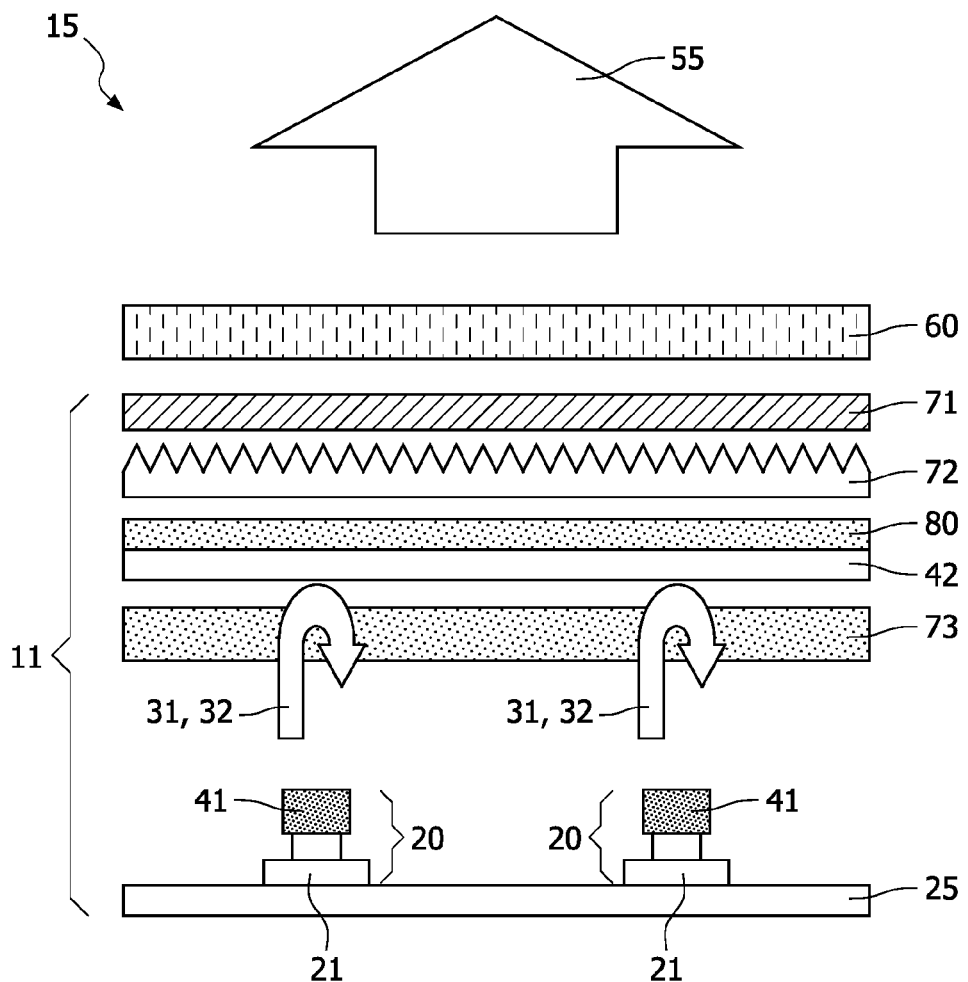
FIG. 4 shows a schematic cross-sectional view of a display device according to the invention.

A still further advantage is obtained when the illumination system 10 comprises a plurality of semiconductor light-emitting devices, typically in a two-dimensional array. When configured as a backlight, the first Yellow light 32 emitted by the first phosphor layer 41 of each semiconductor light-emitting device 20 has a distance of about 25 mm (1-inch is the typical thickness of an LCD backlight) to mix, thereby averaging out color and intensity differences between the light-emitting devices 20. Alternatively, the mixing may also be improved by reducing the pitch between light-emitting devices 20—typically, if the light-emitting device 20 is a Lambertian emitter, a backlight will produce a homogeneous output light 50 if $T=0.9 \times P$, where T is the thickness of the backlight and P is the pitch between the light-emitting devices. As the skilled person will appreciate, mixing may also be influenced by the introduction of secondary optics as depicted in FIG. 4. Alternatively, the mixing may be further improved by the introduction of secondary optics associated with each semiconductor light emitting device to broaden the radiation pattern of the light emitted from said semiconductor light emitting devices.

FIG. 4 shows a display device 15 according to the invention, where the illumination system 11 is configured as a backlight for an LCD panel 60. Illumination system 11 is the same as illumination system of 10 of FIG. 1, except for the following differences:

a) a substrate 25 on which one or more semiconductor light-emitting devices 20 are mounted. This is convenient when more than one device 20 is mounted on the same substrate 25, such as a metal, e.g. aluminum or steel, substrate, which is provided with a diffuse reflective coating or layer on the top surface (facing the LCD panel) around the locations of the semiconductor light emitting devices, and further provides heat transport, mechanical functionality, and optionally electrical interconnectivity;

b) a bulk diffuser 73, disposed between the first phosphor layer 41 and the second phosphor layer 42. The Blue light 31 and the first Yellow light 32 from each semiconductor light-emitting device 20 may have color and intensity differences which need to be averaged out in some way. Typically, this is done by employing a diffuser 73 to mix these individual outputs;

c) a cover plate 80, which is used in this embodiment as a carrier for the second phosphor layer 42, the second phosphor layer being applied to the side of the cover plate nearest to the semiconductor light-emitting devices 20. Optionally, the cover plate may also comprise a diffuser, or be provided with a diffusive surface texture, or the second phosphor layer may be embedded within the cover plate or the phosphor layer may be applied on the side of the cover plate 80 closest to the LCD panel 60;

d) a brightness-enhancing film (BEF) 72, which is known in the art, to increase the FoS brightness in a direction approximately normal to the surface, but which also enhances mixing thanks to the relative large fraction of light that is reflected upon incidence on said film;

e) optionally, a dual brightness enhancing film (DBEF) may be used, which is a reflective polarizer 71 which is also known in the art, and which also enhances mixing, and f) the output light 55 has the final color at the Front-of-Screen of the LCD panel which is perceived by the user. This is the output light of the illumination system 11 which has undergone a shift in color point due to the optical characteristics of the LCD panel 60.

A portion of the Blue light 31, the first Yellow light 32, and the second Yellow light 33 may also be reflected back towards the light-emitting devices 20 by the optical components, for example, the diffuser 73, the cover plate 80, the brightness enhancement film 72, the reflective polarizer 71 and the LCD panel 60. Components of this reflected light may also be absorbed by the first phosphor layer 41 or by the second phosphor layer 42, increasing the emission of the phosphor material in the first phosphor layer 41 and/or by the second phosphor layer 42.

Alternatively, the second phosphor layer 42 may also be applied to one of the other optical elements in the display device 15, such as the bulk diffuser 73, the brightness enhancing film 72, the reflective polarizer 71 or the LCD panel 60 itself. It is possibly also advantageous from a manufacturing point of view to provide the second phosphor layer 42 on a separate substantially transparent carrier which can be placed, during manufacture of the display device 15, at a convenient position between the first phosphor layer 41 and the LCD panel 60.

Other suitable phosphor materials which may be used in the first luminescent element 41 are oxynitrido-silicate phosphors. These have the general formula:

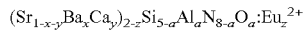

wherein $0 \leq x \leq 1$, $0 \leq y \leq 1$, $(x+y) \leq 1$, $0 \leq a < 5$, $0 < z \leq 0.2$ In particular, Eu-activated oxynitrido-silicate phosphors may be used. These include SSON:Eu.

Although the embodiment of FIG. 1 has been described as using light of the primary colors Blue (31), a first Yellow (32) and a second Yellow (33), it will be obvious to the skilled person that any suitable combination of colors may be used in the invention. The choice will depend upon the requirements of the output light 50, the choice of semiconductor light-emitting devices 20, and the choice of luminescent elements 41, 42.

Figure 5:
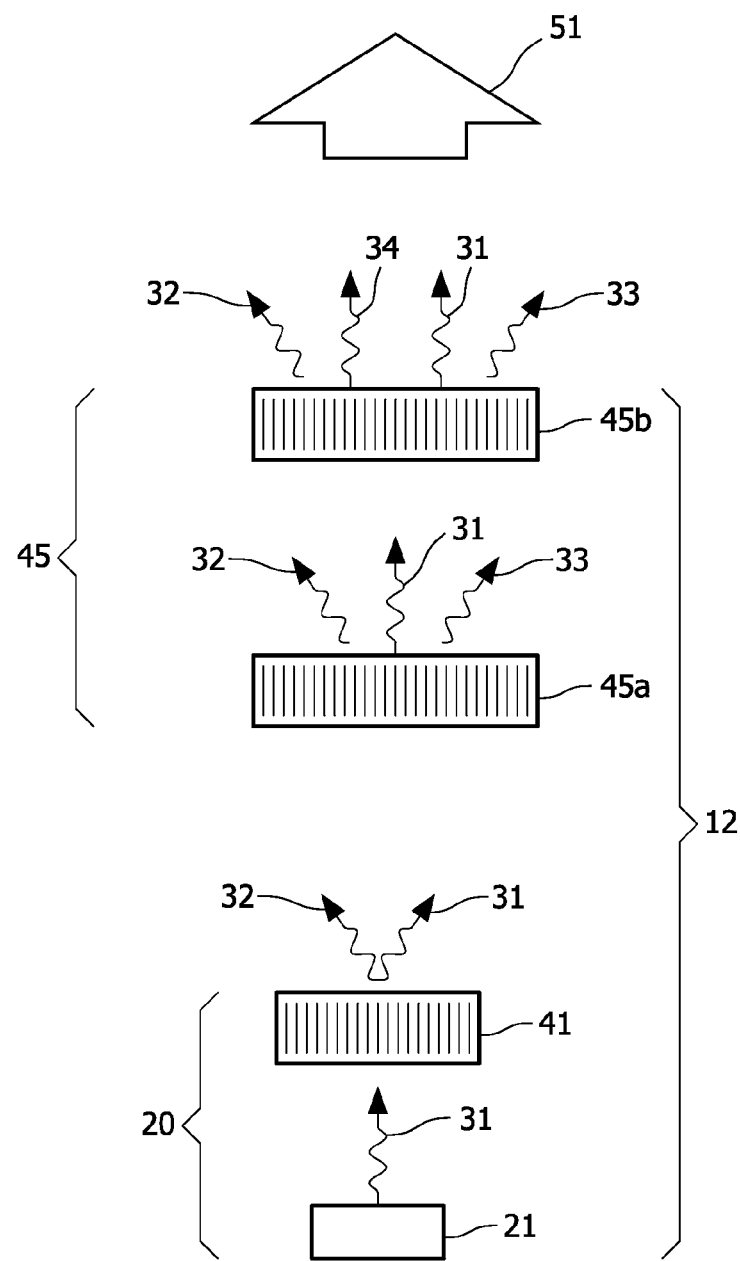
FIG. 5 depicts a schematic cross-sectional view of an illumination system according to the invention.

FIG. 5 depicts a schematic cross-sectional view of an illumination system according to the invention. Illumination system 12 comprises the following differences with respect to the illumination system 10 of FIG. 1:

a) the second phosphor layer 45 comprises more than one phosphor material. In FIG. 5, the second phosphor layer 45 comprises two adjacent sub-layers—a first 45a and second 45b phosphor sub-layer—, but as the skilled person will appreciate, any number of phosphor sub-layers may be used. It will also be apparent to the skilled person that the second phosphor layer 45 may be a single layer comprising a mixture of two or more phosphor materials, or adjacent patterns of different phosphor materials;

b) the first phosphor sub-layer 45a is arranged to intercept at least some of the Blue light 31, and comprises a phosphor material which is selected to emit a second Yellow light 33 due to the excitation by the Blue light 31; and c) the second phosphor sub-layer 45b is arranged to intercept at least some of the Blue light 31, and comprises a phosphor material which is selected to emit a Green light 34 due to the excitation by the Blue light 31.

During operation, the emitted first Yellow light 31 passes through both sub-layers 45a and 45b of the second phosphor layer 45 and leaves the illumination system 12 as part of the output light 51. The first sub-layer 45a of the second phosphor layer 45 absorbs the Blue light 31 passing through the first phosphor layer 41 and emits the second Yellow light 33 which passes out of the illumination system 11 to become a part of the output light 51. The second sub-layer 45b of the second phosphor layer 45 absorbs the Blue light 31 passing through the first phosphor layer 41 and through the first sub-layer 45b, and then emits the Green light 34 which passes out of the illumination system 12 to become a part of the output light 51.

Blue light 31 also passes through the second phosphor layer 45 to a degree determined by the effective phosphor layer thickness and/or the patterning of the phosphor material in the first and second phosphor sub-layers 45a and 45b. The illumination system 12 of FIG. 5 produces a white output light 51 comprising Blue light 31, first Yellow light 32, second Yellow light 33 and Green light 34, and is suitable for use as a backlight for an LCD display.

Alternatively, the phosphor material in the second phosphor sub-layers 45a and 45b may be selected to absorb at least a part of the first Yellow light 32 to cause excitation of the phosphor. The phosphor materials in the second phosphor sub-layer 45b may also be selected to absorb at least a part of the second Yellow light 33 to cause excitation of the phosphor. It will also be apparent to the skilled person that in this alternative one or more phosphor materials in the second phosphor layer 45 may be selected to also absorb both the Blue light 31 and the first Yellow light 32 to cause excitation of the second phosphor layer 45.

Figure 6A:
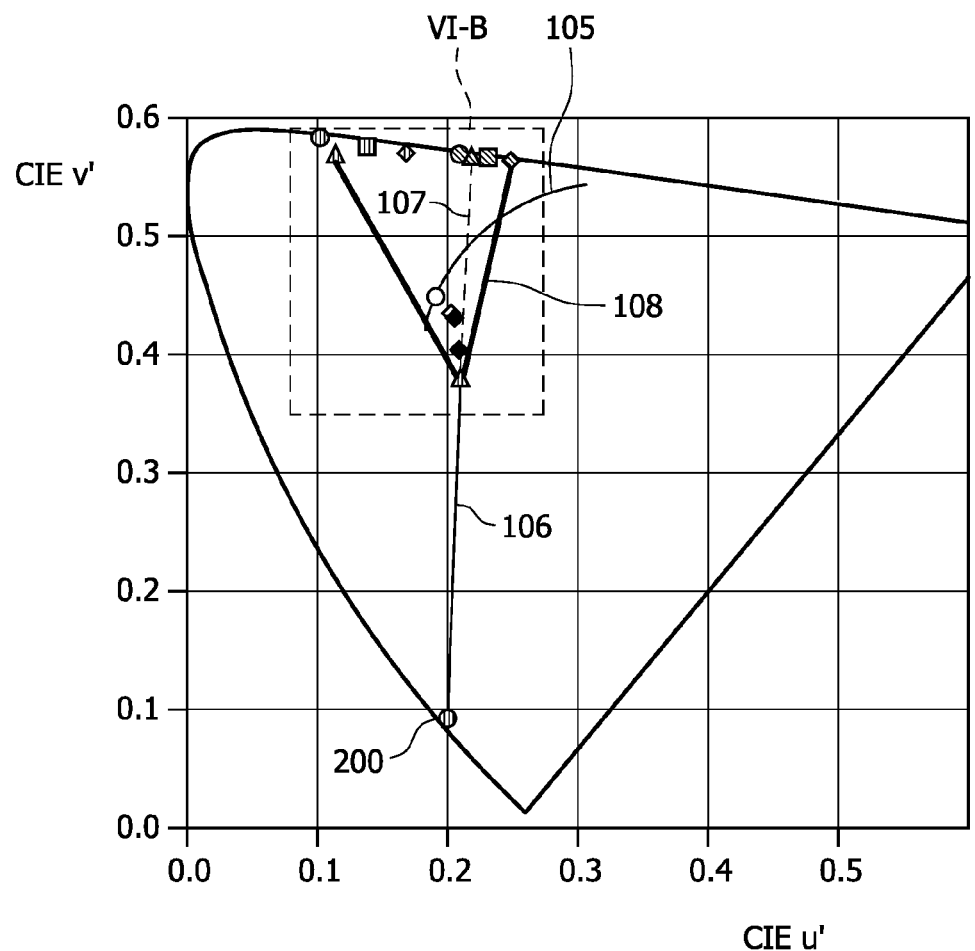
FIG. 6A depicts a 1976 CIE chromaticity diagram showing the color space for an illumination system according to the invention.
Figure 6B:
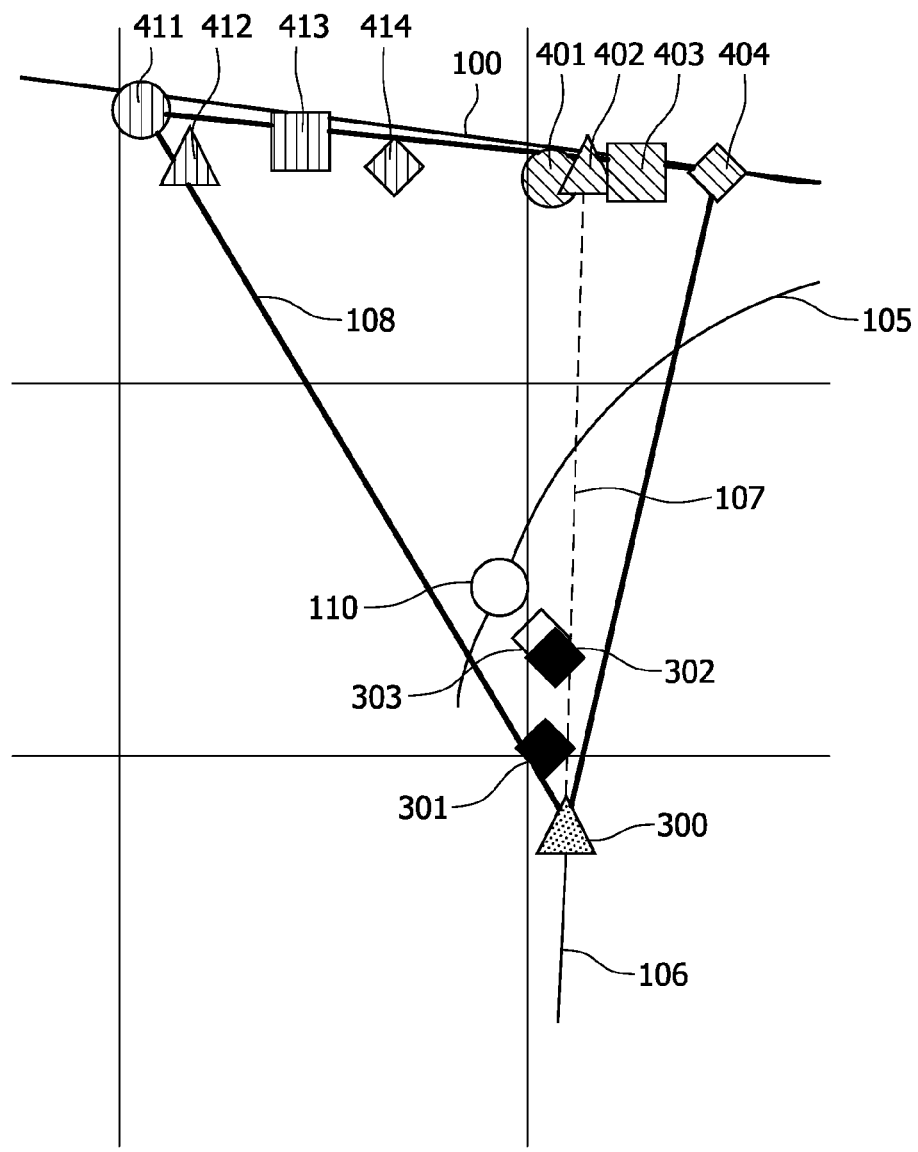
FIG. 6B shows an enlarged view of the centre portion VI-B of FIG. 6A.

FIGS. 6A and 6B depict a 1976 CIE chromaticity diagram showing the color space 107 available for tuning the color of the output light 51 from the illumination system 12 of FIG. 5. FIG. 6B shows an enlarged view of the centre portion VI-B of the chart shown in FIG. 6A. FIGS. 6A and 6B are similar to FIGS. 2A and 2B, but with the following modifications:

a) 411, 412, 413 and 414 are the color points for Green phosphors TG:Eu, BOSE, SSON:Eu, and LuAG:Ce, respectively;

b) YAG:Ce with color point 402 is employed as the phosphor material in the first phosphor layer 41 of FIG. 5. Locus 106 in FIGS. 6A and 6B therefore represents the color change in the output light 51 as the amount of phosphor materials in the first phosphor layer 41 is varied. The amount of conversion in the first phosphor layer 41 is configured to adjust the color point of the output light 51 along locus 106 away from the color point for the blue semiconductor light emitting device 200 to the target point 300;

c) the second phosphor layer 45 comprises a first sub-layer 45a with (Y,Gd)AG:Ce phosphor material, which has a color point 404 of a slightly longer dominant wavelength (towards Orange) than the color point 402 for YAG:Ce; and d) the second phosphor layer 45 further comprises a second sub-layer 45b with TG:Eu phosphor material, which has a color point 411 of a shorter wavelength (towards Green) than the color point 402 for YAG:Ce.

The result is that the possible colors of the output light 51 available as the amount of conversion by the three phosphor materials is varied may be represented by a triangle of color adjustment 108, the corners being defined by the target point 300 for the first phosphor layer 41, the color point 404 for (Y,Gd)AG:Ce phosphor in the first phosphor sub-layer 45a, and the color point 411 for TG:Eu phosphor in the second-sub-layer 45b. This allows a color point of the output light 51 to be chosen which coincides with the color point required by the different manufacturers 301, 302, 303.

This flexibility in tuning the color point of the output light 51 is available because phosphors which are sensitive to thermal quenching may be used in a second phosphor layer 45. For example, replacing part of the Yttrium (Y) in a YAG:Ce phosphor by Gd (gadolinium), resulting in (Y,Gd)AG:Ce, induces a red-shift in the emission spectrum, but it also increases the sensitivity to thermal quenching. By reducing the amount of conversion which needs to be done by the phosphor, the thermal load on the phosphor is reduced. For the same reason, phosphors which are sensitive to saturation may also be employed to fine-tune the color output of the illumination system 11. The phosphors can therefore be primarily chosen for their color contribution, allowing a much higher degree of color tuning and the ability to exactly match the manufacturer's requirements.

Figure 7:
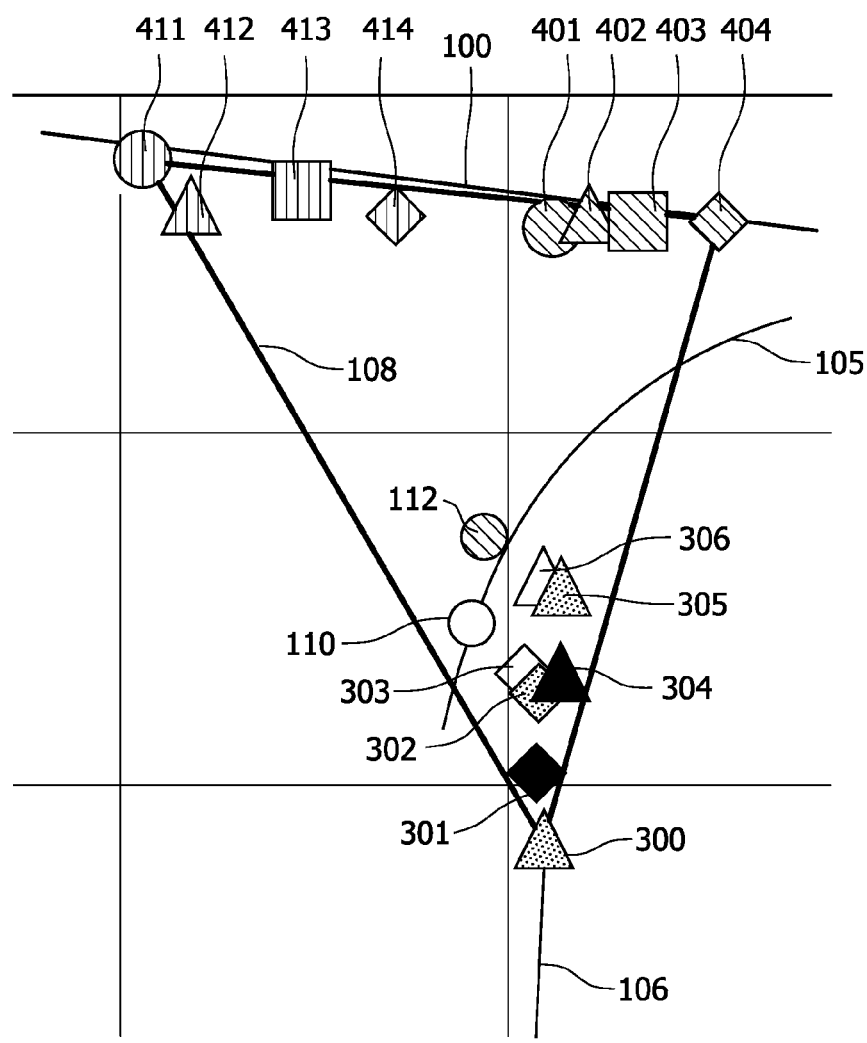
FIG. 7 depicts a 1976 CIE chromaticity diagram showing the color space for an illumination system according to the invention.

Phosphor materials may also be combined in a single layer to obtain intermediate color points. Manufacturers' target points are also shown in FIG. 7, which depicts the same triangle of color adjustment 108 as depicted in FIG. 6. Target points 301, 302 and 303 are required to achieve the 9000K color point Front-of-Screen for LCD panels from three different manufacturers, and target points 304, 305 and 306 are required to achieve the D65 color point 112 at the Front-of-Screen for the same manufacturers' panels, respectively. All target points are within the triangle of color adjustment 108, and therefore the color point of the output light 51 may be selected to coincide with the appropriate target.

Figure 8:
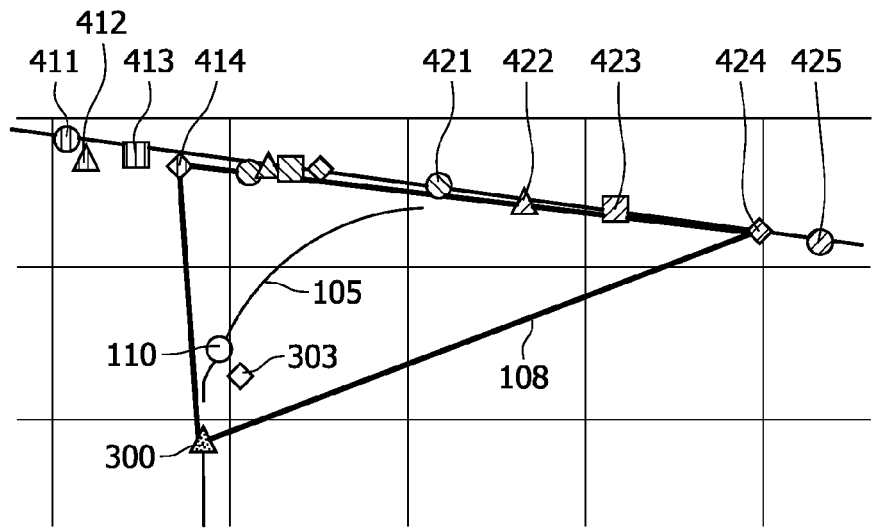
FIG. 8 depicts the central portion of a 1976 CIE chromaticity diagram for an illumination system according to the invention.
Figure 9:
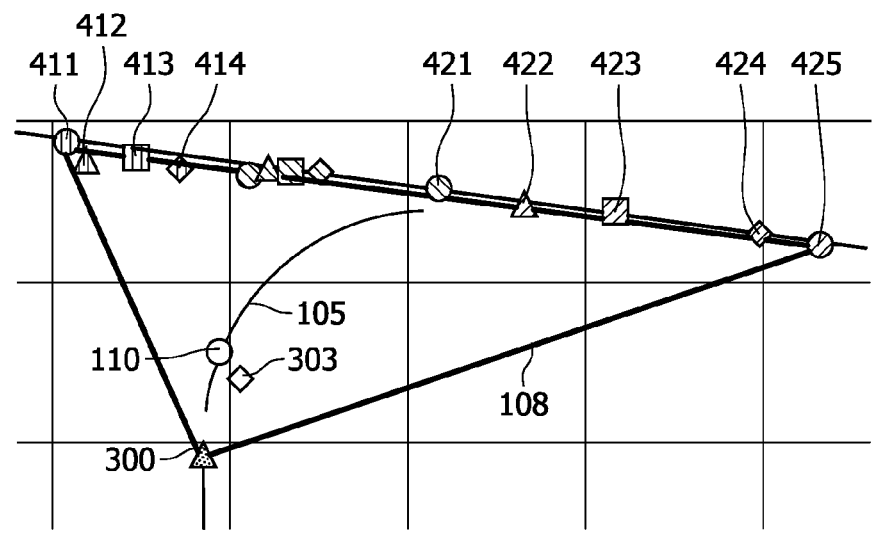
FIG. 9 depicts the central portion of a 1976 CIE chromaticity diagram for an illumination system according to the invention.

It will be apparent to the skilled person that the corners of the triangle of adjustment 108 may be moved by choosing a different phosphor material or a different combination of phosphor materials in the appropriate phosphor sub-layer 45a or 45b:

a) for example, FIG. 8 depicts the triangle of adjustment 108 when the second phosphor layer 45 comprises a Green phosphor (in this case LuAG:Ce with the color point 414) and a Red phosphor (in this case, SCASN:Eu with the color point 424). Other possible Green phosphors with a corresponding color point which may be used are TG:Eu 411, BOSE 412, and SSON:Eu 413, or any suitable combination to obtain an intermediate color point. Note that BOSE is sensitive to thermal quenching, and thus the invention allows more flexibility in its use as a phosphor. Note further that TG:Eu is sensitive to hydrolysis and requires a passivation layer that generally performs less at elevated temperatures, and thus the invention allows more flexibility in its use as a phosphor, enabling larger color gamuts for LCD panels without significantly reducing the efficiency of the system. Other possible Orange/Red phosphors with a corresponding color point which may be used are nitride-silicate phosphors. These have the general formula:

$$(Sr_{1-x-y}Ba_xCa_y)_{2-z}Si_{5-a}Al_aN_{8-a}O_a:Eu_z^{2+}$$

where $0 \leq x \leq 1$, $0 \leq y \leq 1$, $0 \leq a < 5$, $0 < z \leq 1$
Examples include: BSSN:Eu amber 421, BSSN:Eu red 422, SCASN:Eu 423, or any suitable combination to obtain an intermediate color point;

b) for example, FIG. 9 depicts an even larger triangle of color adjustment 108 which may be achieved when TG:Eu is chosen as the Green phosphor (color point 411), and CaS:Eu (color point 425) is chosen as the Red phosphor. TG:Eu and CaS:Eu are sensitive to thermal quenching, and thus the invention allows more flexibility in its use as a phosphor. More importantly, CaS:Eu and TG:Eu are sulphide-phosphors which are preferably not applied in a clean-room when semiconductor light-emitting devices 20 are being manufactured because of the contamination they can cause. It is therefore not practical to incorporate sulphide phosphors into the first phosphor layer 41. However, they may be incorporated into a second phosphor layer 45, because the second phosphor layer 45 is added to the illumination system 11 outside of the clean-room and after the sulfide phosphors have been sufficiently passivated by embedding them in a shielding matrix material to form a stable phosphor layer.

Green/yellow phosphor materials suitable for use in the second phosphor layer 45 include:
(i) garnet phosphors in general;
(ii) Ce-activated garnet phosphors, for example YAG:Ce, (Y,Gd)AG:Ce, (Y,Lu)AG:Ce, (Y,Lu,Gd)AG:Ce, (Lu,Gd)AG:Ce and LuAG:Ce;
(iii) Ce-activated garnet phosphors comprising Si and N, for example YAGSN:Ce, LuAGSN:Ce, (Y,Lu,Gd)AGSN:Ce, (Y,Gd)AGSN:Ce and (Lu,Gd)AGSN:Ce;
(iv) oxynitrido-silicate phosphors, which have the general formula:

$$(Sr_{1-a-b}Ca_bBa_c)Si_xN_yO_z:Eu_a^{2+}$$

wherein $0 < a < 0.25$, $0 \leq b < 1$, $(a+b) < 1$, $0 \leq c < 1$, $1.5 < x < 2.5$, $1.5 < y < 2.5$, $1.5 < z < 2.5$;
(v) Eu-activated oxynitrido-silicate phosphors such as SSON:Eu;
(vi) thiogallate phosphors, which have the general formula:

$$(Sr_{1-x-y-z}Mg_xCa_yBa_z)(Ga_{2-u-v}Al_uIn_v)S_4:Eu^{2+}$$

wherein $0 \leq x \leq 1$, $0 \leq y \leq 1$, $0 \leq z \leq 1$, $(x+y+z) \leq 1$, $0 \leq u \leq 1$, $0 \leq v \leq 1$, $(u+v) < 1$;
(vii) Eu-activated thiogallate phosphors such as TG:Eu; and any combination thereof.

Red phosphor materials suitable for use in the second phosphor layer 45 include:
(i) nitride-silicate phosphors in general;
(ii) Eu-activated nitride-silicate phosphors, such as BSSN:Eu, SCSN:Eu, SSN:Eu, SCASN:Eu, and CASN:Eu;
(ii) sulfide phosphors in general;
(iv) Eu-activated sulfide phosphors such as SrS:Eu, CaS:Eu, and (Sr, Ca)S:Eu;
and any combination thereof.

Figure 10:
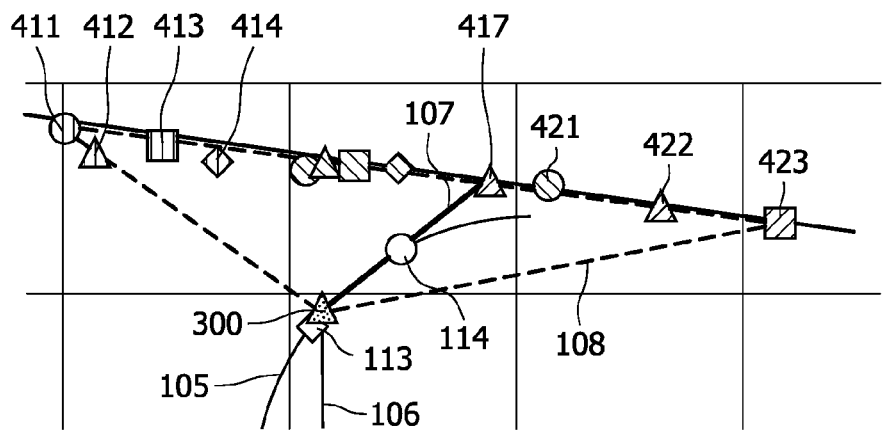
FIG. 10 depicts the central portion of a 1976 CIE chromaticity diagram for an illumination system according to the invention.

FIG. 10 depicts the effects of using a second phosphor layer 45 comprising a mixture of phosphor materials having a fixed phosphor ratio of TG:Eu (Green—color point 411) to SSN:Eu (Red—color point 423). The mixture provides an intermediate color point 417. The first phosphor layer 41 determines the end point of locus 106, which is the target point 300 located on or very close to the BBL with a color temperature close to about 5000K, and the intermediate color point 417 provides the end point of locus 107, enabling accurate tuning of the color of the output light 51 substantially along the locus 107. This locus 107 coincides with the black body locus 105 between the 5000K color point 113 and the 3000K color point 114. For comparison, the triangle of color adjustment 108 which would be provided by a second phosphor layer 45 comprising a first sub-layer 45a with TG:Eu (Green—color point 411) and a second sub-layer 45b with SSN:Eu (Red—color point 423) is also depicted.

Note that SSN:Eu (color point 423) is sensitive to both quenching and saturation, and thus the invention allows more flexibility in its use as a phosphor. SSN:Eu is particularly desirable because it has a high luminous equivalence, while still enabling a good Color Rendering Index (CRI), and therefore is a preferred phosphor for general lighting systems, e.g. for task lighting or product highlighting applications. Note that by applying a combination of Red-Orange and Yellow phosphors, better color rendering properties are obtained than with only a Yellow phosphor. Note that by applying a combination of Red and Green phosphors an even higher CRI is obtained.

Figure 11:
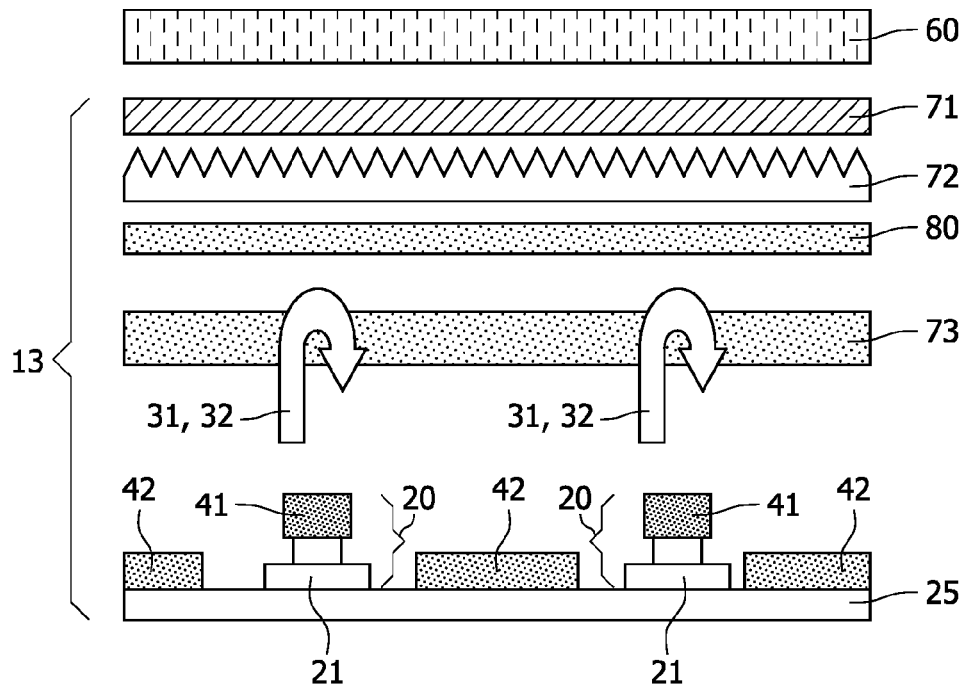
FIG. 11 depicts a display device according to the invention.

FIG. 11 shows a display device 16 according to the invention, where the illumination system 13 is configured as a backlight for an LCD panel 60. Illumination system 13 is the same as the illumination system 11 of FIG. 4 except for the following difference:
a) the second phosphor layer 42 is located on the substrate 25, between the semiconductor light-emitting devices 20. The second phosphor layer 42 is excited by the Blue light 31 and/or the first Yellow light 32 reflected back towards the semiconductor light-emitting devices 20 by the optical components comprised in the display device 16.

Alternatively, the second phosphor layer 42 may be replaced by the second phosphor layer 45 according to the invention.

Figure 12:
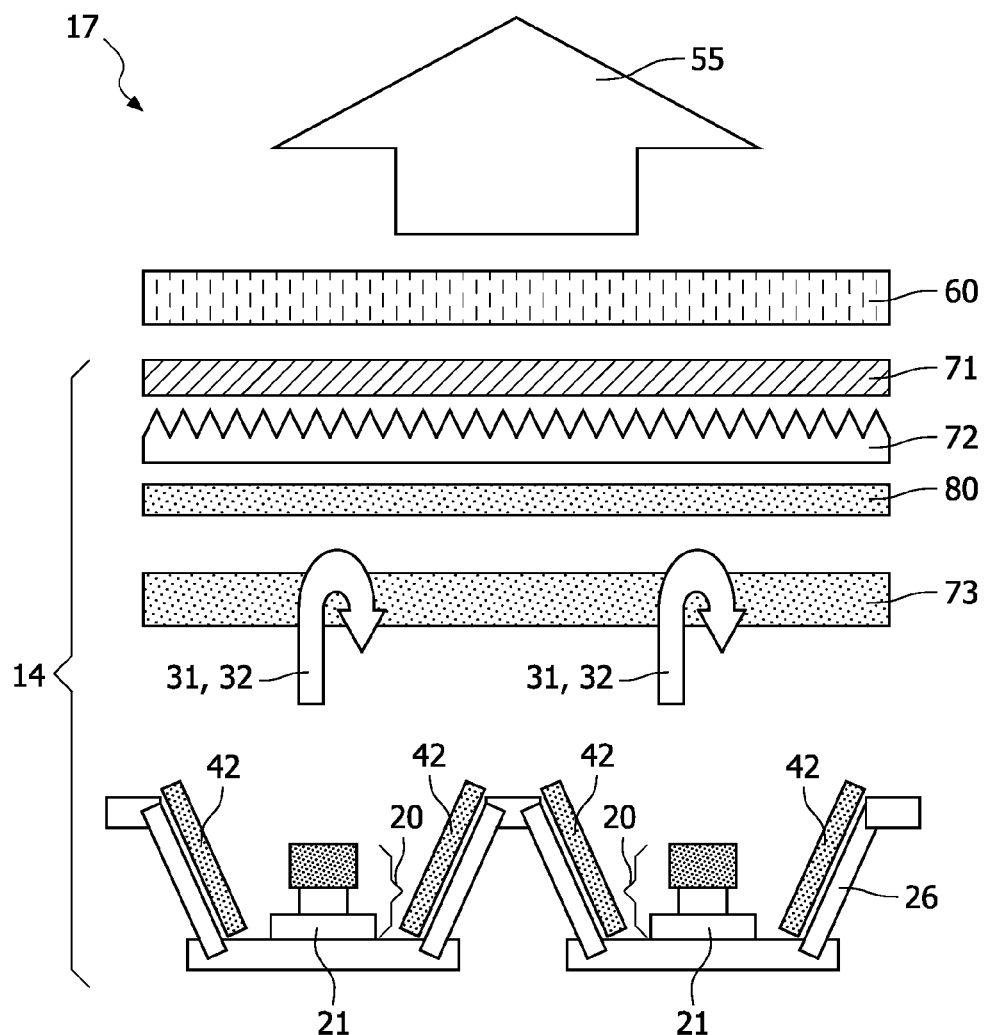
FIG. 12 depicts a display device according to the invention.

FIG. 12 shows a display device 17 according to the invention, where the illumination system 14 is configured as a backlight for an LCD panel 60. Illumination system 14 is the same as the illumination system of 13 of FIG. 11 except for the following difference:
a) the light-emitting devices 20 are each located in a recess or well, formed in the substrate 26. The form of the recess in substrate 26 is such that the sidewall of the recess faces the light-emitting device 20. The sidewall may be a curved surface, such as a sphere or cylinder or cone, or it may comprise 3 or more planar surfaces, such as a polyhedron. Therefore, it may specifically have forms such as an inverted baseless cube, an inverted baseless prism, a baseless inverted hemisphere, an inverted baseless cylinder, an inverted baseless cone, an inverted baseless truncated cone, an inverted pyramid, or an inverted truncated baseless pyramid. The substrate 26 may also be compared to an egg-box, with a semiconductor light-emitting device 20 being located in each recess;

b) the second phosphor layer 42 is located on the sidewalls of each well of the substrate 26. The second phosphor layer 42 is excited by the Blue light 31 and/or the first Yellow light 32 reflected back towards the semiconductor light-emitting devices 20 by the optical components comprised in the display device 17.

Alternatively, the recess may also be formed by a separate structure located on the substrate 20, such that sidewalls are provided facing the semiconductor light-emitting devices 20.

Alternatively, the second phosphor layer 42 may be replaced by the second phosphor layer 45 according to the invention.

Figure 13:
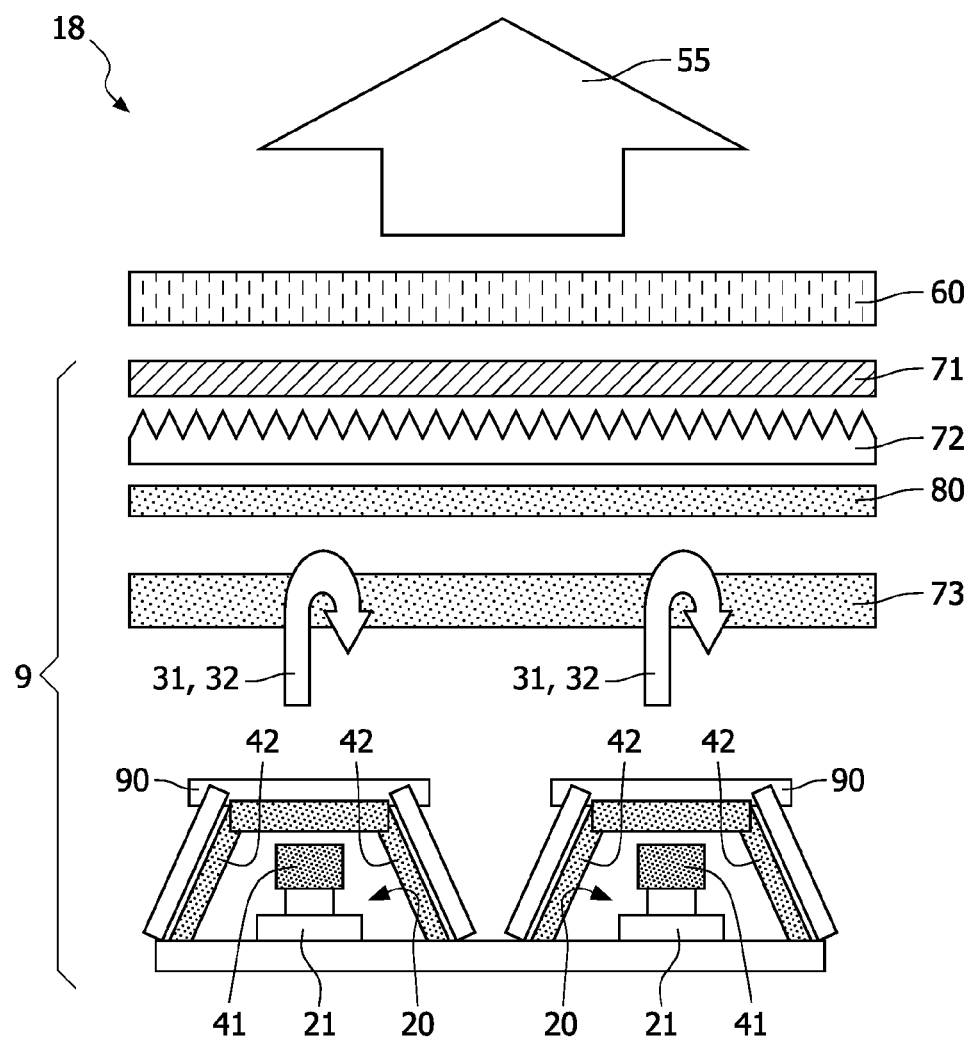
FIG. 13 depicts a display device according to the invention.

FIG. 13 shows a display device 18 according to the invention, where the illumination system 9 is configured as a backlight for an LCD panel 60. Illumination system 9 is the same as the illumination system 13 of FIG. 11 except for the following difference:

a) a transparent cup 90 is disposed over and around each of the light-emitting devices 20. The form of the cup 90 is such that the sidewall of the cup faces the light-emitting device 20. The sidewall may be a curved surface, such as a sphere or cylinder or cone, or it may comprise 3 or more planar surfaces, such as a polyhedron. Therefore, it may specifically be in the form of, for example, a cube, a prism, a hemisphere, a truncated hemisphere, a truncated cone, a pyramid, or a truncated pyramid;

b) the second phosphor layer 42 is located on the sidewalls of each cup, either on the side facing the light-emitting device 20 or on the side facing the LCD panel 60. The second phosphor layer 42 is excited by the Blue light 31 and/or the first Yellow light 32 which is reflected back towards the semiconductor light-emitting devices 20 by the optical components comprised in the display device 17.

Alternatively, the second phosphor layer 42 may be replaced by the second phosphor layer 45 according to the invention.

Figure 14:
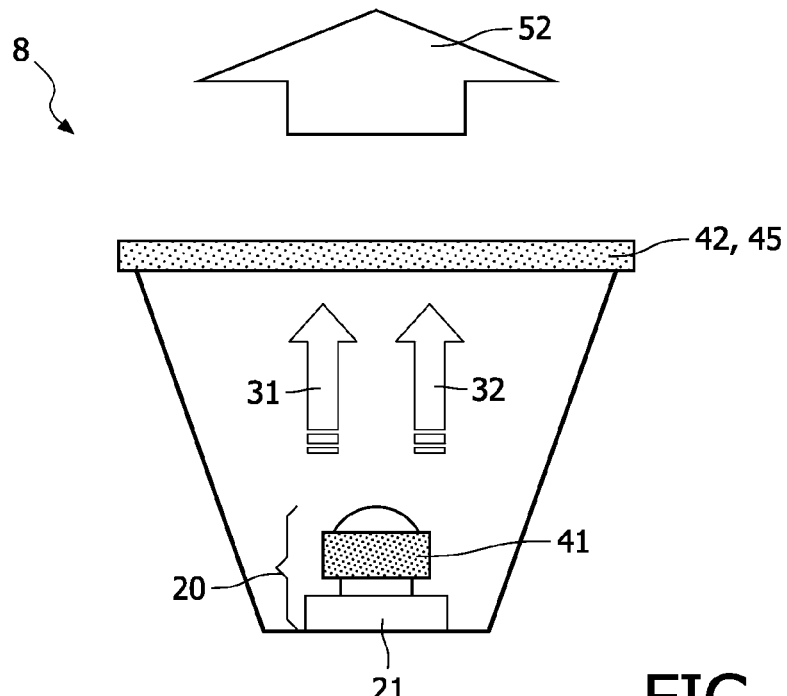
FIG. 14 depicts an illumination system according to the invention.
Figure 15:
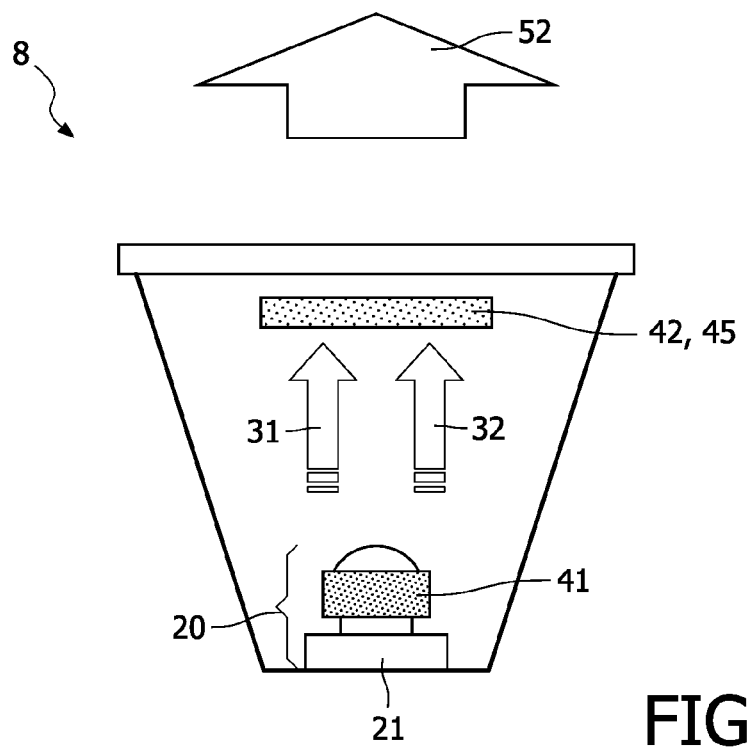
FIG. 15 depicts an illumination system according to the invention.
Figure 16:
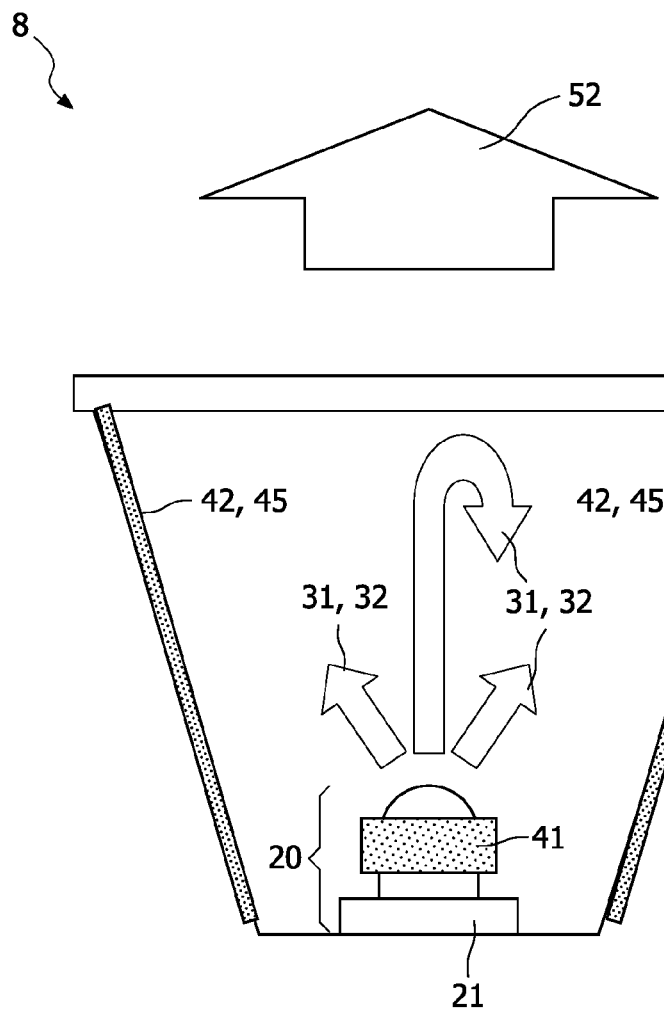
FIG. 16 depicts an illumination system according to the invention.

FIGS. 14, 15 and 16 depict illumination systems 8 suitable for functional and/or decorative requirements, which may be constructed and operated in a similar way to the embodiments of the invention described above. The advantage of being able to choose the phosphor materials comprised in the second luminescent element mainly on color characteristics means that the color point of output light 52 may be tuned to a wide range of colors. This is particularly advantageous in decorative applications.

It will be obvious to the skilled person that the phosphor sub-layers 45a and 45b may also be physically separated from each other—for example:

a) in FIG. 11, the first sub-layer 45a may be located on one of the optical components, such as the cover plate 80, and the second phosphor sub-layer 45b may be located on the substrate 25, between the semiconductor light-emitting devices 20;

b) in FIG. 12, the first sub-layer 45a may be located on one of the optical components, such as the cover plate 80, and the second phosphor sub-layer 45b may be located on the substrate 25, between the semiconductor light-emitting devices 20.

It should be noted that the above-mentioned embodiments illustrate rather than limit the invention, and that those skilled in the art will be able to design many alternative embodiments without departing from the scope of the appended claims. For example, many of the embodiments refer to a backlight for an LCD panel, but the illumination systems of the embodiments may be generally employed in lighting fixtures, which may be both functional and decorative. The invention provides a higher degree of freedom in utilizing the color characteristics of phosphors than the prior art.

Several of the examples depict an illumination system where the light of primary colors is led directly to the output, and mixing of the light may occur in the room between optical components. It will be obvious to the skilled person that the invention may be employed in so-called side-lit systems, where the light of primary colors is coupled into one or more light guides for transport and/or mixing of the light of primary colors. In such a side-lit configuration, the second luminescent element 42, 45 may be located at a convenient point in a light-guide, such as the 180-degree reflector in a folded light-guide, or the second luminescent element 42, 45 may comprise one or more phosphor layers applied to an interface of the light-guide, or the light-guide may integrally comprise one or more phosphor materials in a similar way to the cover plate 80 of FIG. 4.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

TABLE 2A

Red sulfide phosphors - abbreviations and formulas

| Abbreviation | Formula | General group/general formula |
|---|---|---|
| (Ca,Sr)S: Eu | (Ca,Sr)S: $Eu^{2+}$ | Eu-activated sulfide phosphors comprising Sr and Ca; $(Ca_{1-a}Sr_x)S: Ce_a^{3+}$, wherein $0 < x < 1$, $0 < (x + a) < 1$, $0 < a < 0.2$ |
| CaS: Eu | CaS: $Eu^{2+}$ | Eu-activated sulfide phosphors comprising Ca |
| SrS: Eu | SrS: $Eu^{2+}$ | Eu-activated sulfide phosphor comprising Sr |

TABLE 2B

Red/amber nitride phosphors - abbreviations and formulas

| Abbreviation | Formula | General group/general formula |
|---|---|---|
| SSN: Eu | $Sr_2Si_5N_8: Eu^{2+}$ | Eu-activated nitride-silicate phosphor comprising Sr, of the general formula $(Sr_{1-x-y}Ba_xCa_y)_{2-z}Si_{5-a}Al_aN_{8-a}O_a: Eu_z^{2+}$ where $0 \leq x \leq 1$, $0 \leq y \leq 1$, $0 \leq (x + y) < 1$, $0 \leq a < 5$, $0 < z \leq 0.2$ |

TABLE 2B-continued

Red/amber nitride phosphors - abbreviations and formulas

| Abbreviation | Formula | General group/general formula |
|---|---|---|
| BSSN: Eu amber | $(Ba,Sr)_2Si_5N_8: Eu^{2+}$ | Eu-activated nitride-silicate phosphor $(Sr_{1-x-y}Ba_xCa_y)_{2-z}Si_{5-a}Al_aN_{8-a}O_a: Eu_z^{2+}$ where $0 < x \leq 1, 0 \leq y \leq 1, (x + y) < 1, 0 \leq a < 5, 0 < z \leq 1$ |
| BSSN: Eu red | $(Ba,Sr)_2Si_5N_8: Eu^{2+}$ | Eu-activated nitride-silicate phosphor $(Sr_{1-x-y}Ba_xCa_y)_{2-z}Si_{5-a}Al_aN_{8-a}O_a: Eu_z^{2+}$ where $0 < x \leq 1, 0 \leq y \leq 1, (x + y) < 1, 0 \leq a < 5, 0 < z \leq 1$ |
| CSN: Eu | $Ca_2Si_5N_8: Eu^{2+}$ | Eu-activated nitride-silicate phosphor comprising Ca, of the general formula $(Sr_{1-x-y}Ba_xCa_y)_{2-z}Si_{5-a}Al_aN_{8-a}O_a: Eu_z^{2+}$ where $0 \leq x \leq 1, 0 < y \leq 1, 0 < (x + y) \leq 1, 0 \leq a < 5, 0 < z \leq 0.2$ |
| SCSN: Eu | $(Sr,Ca)_2Si_5N_8: Eu^{2+}$ | Eu-activated nitride-silicate phosphors comprising Sr and Ca, of the general formula $(Sr_{1-x-y}Ba_xCa_y)_{2-z}Si_{5-a}Al_aN_{8-a}O_a: Eu_z^{2+}$ where $0 \leq x \leq 1, 0 \leq y \leq 1, 0 \leq a < 5, 0 < z \leq 0.2$ |
| CASN: Eu | $CaAlSiN_3: Eu^{2+}$ | Eu-activated nitrido-silicate phosphors comprising Ca |
| SCASN: Eu | $(Sr,Ca)AlSiN_3: Eu^{2+}$, | Eu-activated nitride-silicate phosphors comprising Sr and Ca, of the general formula $(Sr_{1-x-a}Ca_x)AlSiN_3: Eu_a^{2+}$, wherein $0 < x < 1, 0 < a < 0.2, 0 < (x + a) < 1$ |

TABLE 2C

Yellow/green garnet phosphors - abbreviations and formulas

| Abbreviation | Formula | General group/general formula |
|---|---|---|
| YAG: Ce | $Y_3Al_5O_{12}: Ce^{3+}$ | Ce-activated garnet phosphor comprising Y, of the general formula $(Y_{1-a})_3(Al_{1-z}Ga_z)_5O_{12}: Ce_a^{3+}$ wherein $0 \leq z \leq 0.25, 0 < a \leq 0.2$, |
| LuAG: Ce | $Lu_3Al_5O_{12}: Ce^{3+}$ | Ce-activated garnet phosphor, of the general formula $(Lu_{1-a-b})_3(Al_{1-z}Ga_z)_5O_{12}: Ce_z^{3+}Pr_b^{3+}$ wherein $0 \leq z \leq 0.25$, $0 \leq a \leq 0.2$, and $0 \leq b \leq 0.1$, |
| (Y,Lu)AG: Ce | $(Y,Lu)_3Al_5O_{12}: Ce^{3+}$ | Ce-activated garnet phosphor comprising Y and Lu; $(Y_{1-y-a}Lu_y)_3(Al_{1-z}Ga_z)_5O_{12}: Ce_a^{3+}$ wherein $0 < y < 1, (y + a) < 1, 0 \leq z \leq 0.25, 0 < a \leq 0.2$ |
| (Y,Gd)AG: Ce | $(Y,Gd)_3Al_5O_{12}: Ce^{3+}$ | Ce-activated garnet phosphors comprising Y and Gd; $(Y_{1-y-a}Gd_y)_3(Al_{1-z}Ga_z)_5O_{12}: Ce_a^{3+}$ wherein $0 < y < 1, (y + a) < 1, 0 \leq z \leq 0.25, 0 < a \leq 0.2$ |
| (Y,Lu,Gd)AG: Ce | $(Y,Lu,Gd)_3Al_5O_{12}: Ce^{3+}$ | Ce-activated garnet phosphor comprising Y, Lu and Gd; $(Y_{1-x-y-a}Lu_xGd_y)_3(Al_{1-z}Ga_z)_5O_{12}: Ce_a^{3+}$ wherein $0 < x < 1, 0 < y < 1, (x + y + a) < 1, 0 \leq z \leq 0.25, 0 < a \leq 0.2$, or with $Pr^{3+}$ as additional dopant: $(Y_{1-x-y-a-b}Lu_xGd_y)_3(Al_{1-z}Ga_z)_5O_{12}: Ce_a^{3+}Pr_b^{3+}$ wherein $0 \leq x \leq 1, 0 \leq y \leq 1, 0 \leq z \leq 0.25, 0 \leq a \leq 0.2$, and $0 \leq b \leq 0.1$ |
| YAGSN: Ce | $Y_3(Al,Si)_5(O,N)_{12}: Ce^{3+}$ | Ce-activated garnet phosphor comprising Si and N; $Y_{3-a}Al_{5-u-v}Ga_uSi_vO_{12-v}N_v: Ce_a^{3+}$ wherein $0 \leq u \leq 1, 0 < v < 1, 0 < a \leq 0.2$ More in general: Garnet phosphors additionally comprising Si and N, of the general formula $(Y,Lu,Gd)_3(Al,Ga,Si)_5(O,N)_{12}: Ce^{3+}$ |
| LuAGSN: Ce | $Lu_3(Al,Si)_5(O,N)_{12}: Ce^{3+}$ | Ce-activated garnet phosphor comprising Si and N; General formula: $Lu_{3-a}Al_{5-u-v}Ga_uSi_vO_{12-v}N_v: Ce_a^{3+}$ wherein $0 \leq u \leq 1, 0 < v < 1, 0 < a \leq 0.2$ |

TABLE 2C-continued

Yellow/green garnet phosphors - abbreviations and formulas

| Abbreviation | Formula | General group/general formula |
|---|---|---|
| (Y,Lu,Gd)AGSN: Ce | $(Y,Lu,Gd)_3(Al,Si)_5(O,N)_{12}: Ce^{3+}$ | Ce-activated garnet phosphor comprising Si and N; $(Y_{1-x-y-a}Lu_xGd_y)_3(Al_{5-u-v}Ga_uSi_v)O_{12-v}N_v: Ce_a^{3+}$ wherein $0 < x < 1, 0 < y < 1, (x + y + a) < 1$, $0 \leq u \leq 1, 0 < v < 1, 0 < a \leq 0.2$ |

TABLE 2D

Green nitride phosphors - abbreviations and formulas

| Abbreviation | Formula | General group/general formula |
|---|---|---|
| SSON: Eu | $SrSi_2O_2N_2: Eu^{2+}$ | Eu-activated oxynitrido-silicate phosphor of the general formula $(Sr_{1-a-b}Ca_bBa_c)Si_2N_2O_2: Eu_a^{2+}$ wherein $0 < a < 0.25, 0 \leq b < 1$, $(a + b) < 1, 0 \leq c < 1$ |

TABLE 2E

Green sulfide phosphors - abbreviations and formulas

| Abbreviation | Formula | General group/general formula |
|---|---|---|
| TG: Eu | $SrGa_2S_4: Eu^{2+}$ | Eu-activated thiogallate phosphor comprising Sr, Ga and S $(Sr_{1-x-y-z}Mg_xCa_yBa_z)Ga_2S_4: Eu^{2+}$ wherein $0 \leq x \leq 1, 0 \leq y \leq 1$, $0 \leq z \leq 1, (x + y + z) \leq 1$ |

TABLE 2F

Other green/yellow phosphors - abbreviations and formulas

| Abbreviation | Formula | General group/general formula |
|---|---|---|
| BOSE | $(Sr,Ba)SiO_4: Eu^{2+}$ or $(Sr,Ba,Ca)SiO_4: Eu^{2+}$ | General formula: $(Sr_{1-x-y-a}Ba_xCa_y)SiO_4: Eu_a^{2+}$ wherein $0 < x < 1, 0 \leq y < 1$, $0 < (x + y + a) < 1, 0 < a < 0.2$ |

In summary, the invention provides an illumination system comprising a light-emitting device which excites a first luminescent element, which forms part of the light-emitting device. The light emitted from the first luminescent element and/or the light emitted by the light-emitting device excite a second luminescent element, physically separated from the light-emitting device. By employing two luminescent elements, the first element in the light-emitting device, and the second element physically separated from the light-emitting device, such as on a cover plate, the conversion of light produced by the light-emitting device is performed at both a "local" and a "remote" location, respectively, and the amount of luminescent material required at the remote location may be reduced compared to the situation of the prior art where the light conversion was only performed at a remote location

The invention claimed is:
1. An illumination system comprising:
a semiconductor light-emitting device configured to emit light of a first color, the semiconductor device comprising a first luminescent layer configured to absorb part of the light of the first color and to pass part of the light of the first color, the absorbed part of the light of the first color exciting the first luminescent layer causing emission of light of a second color; and
a second luminescent layer separated from the semiconductor light-emitting device by the first luminescent layer and configured to absorb part of the light of the first color and to pass part of the light of the first color and part of the light of the second color, the absorbed part of the light of the first color exciting the second luminescent layer causing emission of light of a third color, the second luminescent layer being formed of the same material as the first luminescent layer and having a thickness different from a thickness of the first luminescent layer,
wherein the illumination system is configured to combine light of the first, second and third colors to form output light of the illumination system, the thickness of the second luminescent layer being selected for correcting a color point of the output light to attain a desired target point of the output light, and
wherein the first luminescent layer is configured to provide a greater degree of light conversion than the second luminescent layer, the degree of light conversion being measurable by the shift in color point on a 1976 CIE chromaticity diagram away from the color point of the color.
2. The illumination system of claim 1, wherein
each of the first luminescent layer and the second luminescent layer comprises a phosphor material; and
the thickness of the first luminescent layer is greater than the thickness of the second luminescent layer.
3. The illumination system of claim 1, wherein the light of the third color has a dominant wavelength that is larger than a dominant wavelength of the light of the second color.
4. The illumination system of claim 1, wherein the second luminescent layer is further configured to absorb at least part of the light of the second color.
5. The illumination system of claim 1, wherein the second luminescent layer comprises two or more phosphor materials separated from each other.
6. The illumination system of claim 4, wherein the absorbed part of the light of the second color excites the second luminescent layer causing emission of light of a fourth color, and the illumination system is configured to combine light of at least one or more of said first, second, third and fourth colors to form the output light of the illumination system.
7. The illumination system of claim 1, wherein the output light of the illumination system appears white.
8. The illumination system of claim 1, wherein the first luminescent layer and the second luminescent layer are arranged to maximize one or more of: luminous equivalent, color rendering index, and gamut of a combination of one or more of the lights of the first, second, and third colors.
9. The illumination system of claim 1, wherein the first luminescent layer and the second luminescent layer are arranged to maximize one or more of: luminous equivalent, color rendering index, and gamut of a combination of one or more of the lights of the first, second, and third colors.

10. The illumination system of claim 1, wherein the second luminescent layer is located on an optical component of the illumination system for separating the second luminescent layer from the semiconductor light-emitting device.

11. The illumination system of claim 10, wherein the optical component comprises a substrate comprising a diffuse reflecting coating, a sidewall of a recess, a cover plate, or a transparent cup.

12. An illumination system comprising:
 a semiconductor die configured to emit light having a first dominant wavelength in a first primary color region of a color spectrum;
 a first luminescent layer configured to absorb a part of the light emitted by the semiconductor die, and to emit light having a second dominant wavelength in a second primary color region of the color spectrum in response; and
 a second luminescent layer configured to absorb a part of the light emitted by the semiconductor die, and to emit light having a third dominant wavelength in the second primary color region of the color spectrum in response, the third dominant wavelength being different from the second dominant wavelength.

13. The illumination system of claim 12, wherein the second luminescent layer is further configured to absorb a part of the light emitted by first luminescent layer.

14. The illumination system of claim 12, wherein an output light of the illumination system comprises a combination of the light emitted from each of the semiconductor die and the first and second luminescent layers.

15. The illumination system of claim 14, wherein an effective thickness of the second luminescent layer is less than an effective thickness of the first luminescent layer.

16. The illumination system of claim 12, wherein the first dominant wavelength is shorter than each of the second dominant wavelength and the third dominant wavelength.

17. The illumination system of claim 16, wherein the second dominant wavelength is shorter than the third dominant wavelength.

18. The illumination system of claim 16, wherein the first primary color region comprises blue light and the second primary color region comprises yellow light.

* * * * *